(12) United States Patent
Kagami et al.

(10) Patent No.: US 7,253,994 B2
(45) Date of Patent: Aug. 7, 2007

(54) MAGNETIC HEAD, HEAD SUSPENSION ASSEMBLY AND MAGNETIC DISK APPARATUS

(75) Inventors: Takeo Kagami, Tokyo (JP); Tetsuya Kuwashima, Tokyo (JP)

(73) Assignee: TDK Corporation, Tokyo (JP)

( * ) Notice: Subject to any disclaimer, the term of this patent is extended or adjusted under 35 U.S.C. 154(b) by 527 days.

(21) Appl. No.: 10/746,045

(22) Filed: Dec. 29, 2003

(65) Prior Publication Data
US 2004/0150921 A1    Aug. 5, 2004

(30) Foreign Application Priority Data
Jan. 6, 2003    (JP)    ............... 2003-000739

(51) Int. Cl.
G11B 5/39    (2006.01)
(52) U.S. Cl. .................................. 360/324.1
(58) Field of Classification Search ............ 360/324.2, 360/319, 324.1, 324.11, 327.1, 327.2, 327.22, 360/327.23, 327.3, 327.31, 327.32
See application file for complete search history.

(56) References Cited

U.S. PATENT DOCUMENTS

| | | | |
|---|---|---|---|
| 6,344,955 B1 | 2/2002 | Sato et al. | |
| 6,381,107 B1* | 4/2002 | Redon et al. | 360/324.2 |
| 6,545,848 B1 | 4/2003 | Terunuma | |
| 7,057,865 B1* | 6/2006 | Mao et al. | 360/324.2 |
| 2001/0012188 A1* | 8/2001 | Hasegawa et al. | 360/324.12 |
| 2002/0030947 A1* | 3/2002 | Chen et al. | 360/319 |
| 2003/0174446 A1 | 9/2003 | Hasegawa | |
| 2003/0202295 A1 | 10/2003 | Wang et al. | |

FOREIGN PATENT DOCUMENTS

| | | |
|---|---|---|
| JP | A 11-175928 | 7/1999 |
| JP | A 2001-68759 | 3/2001 |
| JP | A 2003-264324 | 9/2003 |
| JP | A 2004-030881 | 1/2004 |
| WO | WO 02/23540 A2 | 3/2002 |

OTHER PUBLICATIONS

Nakashio et al, "Longitudinal bias method using a long distance exchange coupling field in tunnel magnetoresistance junctions", Journal of Applied Physics, vol. 89, No. 11, Jun. 1, 2001.

* cited by examiner

*Primary Examiner*—Tianjie Chen
(74) *Attorney, Agent, or Firm*—Oliff & Berridge, PLC

(57) ABSTRACT

A magnetic head has a base, and a magneto-resistive device supported by the base. The magneto-resistive device includes a magneto-resistive layer formed on one surface side of the base, and a first film. The first film is formed to be in contact with an effective region effectively involved in detection of magnetism in the magneto-resistive layer on both sides or one side of the effective region in a track width direction without overlapping with the effective region. The track width direction is substantially parallel to a film surface of the magneto-resistive layer. The first film is a single-layer film or a multiple-layer film. The first film includes a soft magnetic layer which does not form part of a layer for applying a biasing magnetic field to the free layer. The soft magnetic layer contributes to a reduction in side reading.

13 Claims, 18 Drawing Sheets

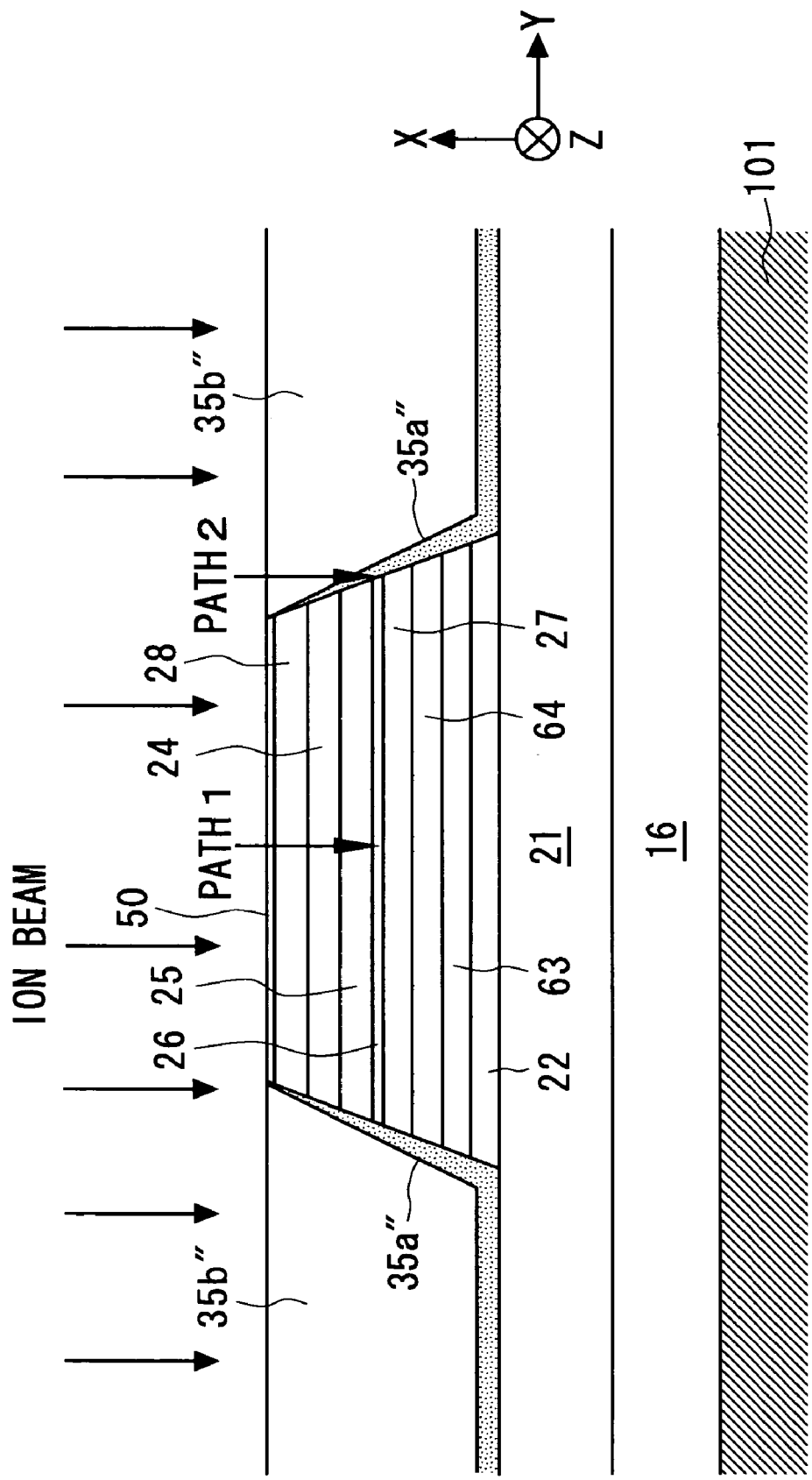

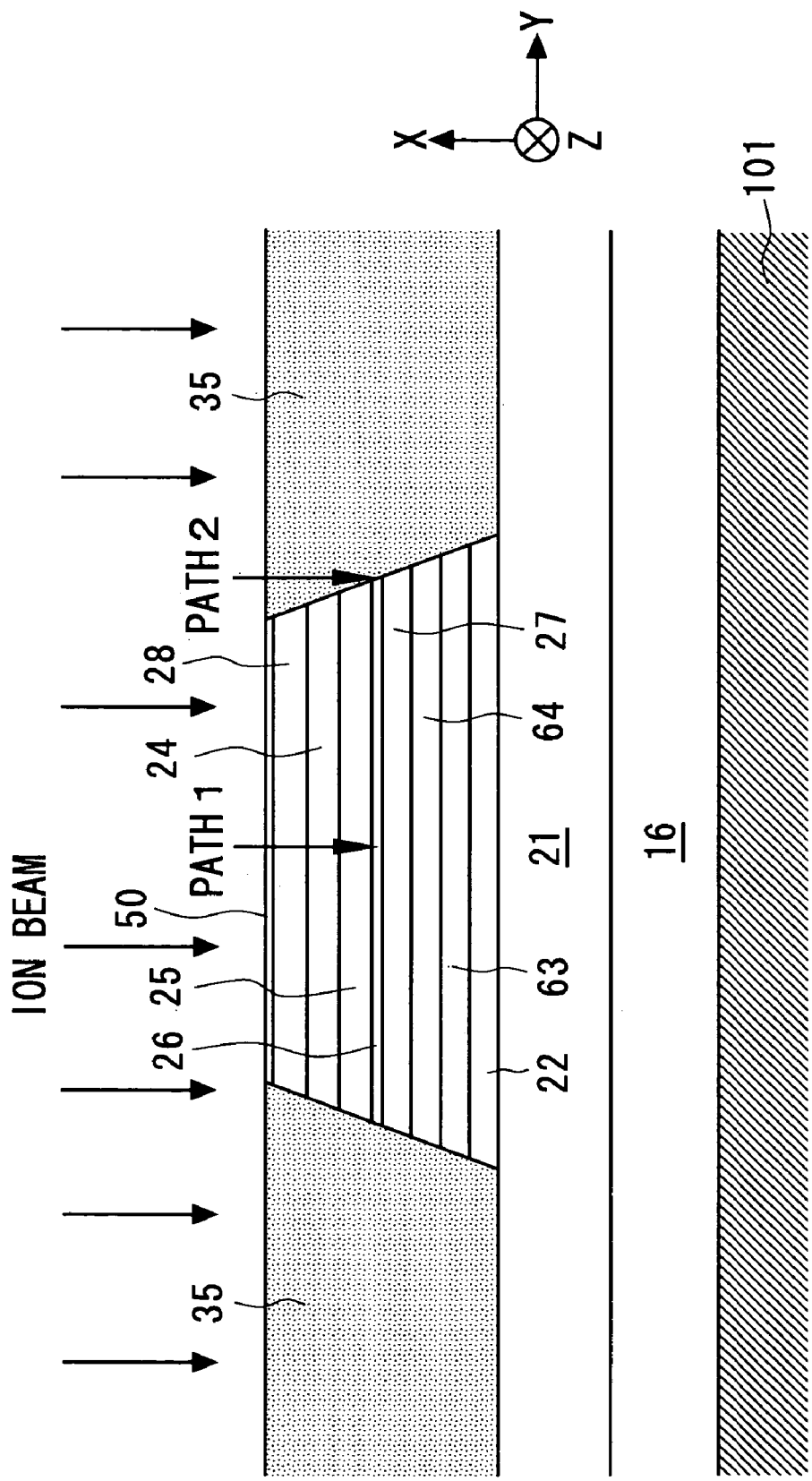

MAGNETIC HEAD, HEAD SUSPENSION ASSEMBLY AND MAGNETIC DISK APPARATUS

BACKGROUND OF THE INVENTION

The present invention relates to a magnetic head, and a head suspension assembly and a magnetic disk apparatus which use the magnetic head.

With the trend to a larger capacity and a smaller size of hard disk drives (HDD), heads are required to have a higher sensitivity and a larger output. To meet these requirements, strenuous efforts have been made to improve the characteristics of GMR heads (Giant Magneto-Resistive Head) currently available on the market. On the other hand, intense development is under way for a tunnel magneto-resistive head (TMR head) which can be expected to have a resistance changing ratio twice or more higher than the GMR head.

Generally, the GMR head differs from the TMR head in the head structure due to a difference in a direction in which a sense current is fed. A head structure adapted to feed a sense current in parallel with a film surface, as in a general GMR head, is referred to as a CIP (Current In Plane) structure, while a head structure adapted to feed a sense current perpendicularly to a film surface, as in the TMR head, is referred to as a CPP (Current Perpendicular to Plane) structure. Since the CPP structure can use a magnetic shield itself as an electrode, it is essentially free from short-circuiting between the magnetic shield and a device (defective insulation) which is a serious problem in reducing a lead gap in the CIP structure. For this reason, the CPP structure is significantly advantageous in providing a higher recording density.

Other than the TMR head, also known as a head in CPP structure is, for example, a CPP-GMR head which has the CPP structure, though a spin valve film (including a specular type and dual spin valve type magnetic multilayer film) is used for a magneto-resistive device.

Any type of CPP-based heads has an upper electrode and a lower electrode for supplying a current to a magneto-resistive layer formed on a base, formed on the top (opposite to the base) and on the bottom (close to the base) of the magneto-resistive layer, respectively. Generally, for reasons of manufacturing process, the base formed with the magneto-resistive layer is left in the atmosphere after the magneto-resistive layer is formed and before the upper electrode is formed. In this event, for preventing the top surface of the magneto-resistive layer from being oxidized in the air to damage the characteristics of the magneto-resistive layer such as an MR ratio, a non-magnetic metal layer, referred to as a "cap layer"[1], is previously formed as a protection film on the top surface of the magneto-resistive layer. The non-magnetic metal layer is preferably made of a material insusceptible to oxidation or a material having a low resistance even if it is oxidized. Ru, Rh, Pt, Au, Ta or the like is used for the non-magnetic metal layer. Then, in the CPP-based head, the upper electrode is electrically connected to the magneto-resistive layer through the non-magnetic metal layer.

A head utilizing a spin valve film or a TMR film is applied with a biasing magnetic field to a free layer in a track width direction, whether it is in CIP structure or in CPP structure, in order to suppress Barkhausen noise. Generally, in the CIP structure, a resist mask used for milling for defining the track width is utilized as it is to form hard magnetic films made of CoCrPt or the like adjacent to both sides of a magneto-resistive layer in the track width direction by a lift-off method as magnetic domain control films. This is referred to as an "abutted structure." Like a CIP-GMR head, the CPP structure also employs the abutted structure to apply a biasing magnetic field to a free layer (see, for example, JP-A-2000-30223 corresponding to U.S. Pat. No. 6,344,955, JP-A-2001-14616 corresponding to U.S. Pat. No. 6,545,848, and the like). In this way, in any type of head, the biasing magnetic field is generally applied to the free layer through the abutted structure.

On the other hand, an article by Nakashio et al., entitled "Longitudinal bias method using a long distance exchange coupling field in tunnel magnetoresistance junctions," Journal of Applied Physics, Vol. 89, No. 11 (Jun. 1, 2001), pp 7356-73583 and JP-A-2001-68759 have proposed magneto-resistive elements (TMR elements) which have an antiferromagnetic layer made of IrMn or the like laminated on a free layer of a magneto-resistive layer as a magnetic domain control film for applying a biasing magnetic field to the free layer. In this TMR element, a non-magnetic metal layer made of Cu or the like is formed on the free layer on a tunnel barrier layer, and the antiferromagnetic layer is formed on the non-magnetic metal layer. According to this TMR element, an exchange bias magnetic field of the antiferromagnetic layer is applied to the free layer in the track width direction through the non-magnetic metal layer as a biasing magnetic field. As a result, the magnetic domain of the free layer is controlled to suppress the Barkhausen noise without fixing the magnetization direction of the free layer.

In a conventional magnetic head which employs the abutted structure, hard magnetic films are simply disposed on both sides of the magneto-resistive layer in the track width direction for use as a magnetic domain control layer for applying a biasing magnetic field to the free layer, but no soft magnetic layer having a magnetic shield effect is provided on both sides of the magneto-resistive layer in the track width direction. Also, in the conventional magnetic head which employs the abutted structure, an insulating layer made of $Al_2O_3$ or $SiO_2$ is disposed not only near an end face of a magneto-resistive layer but also over a region quite far away from the end face on the side of the magneto-resistive layer opposite to a magnetic recording medium side (ABS side), on which the hard magnetic film constituting the magnetic domain control layer for applying a biasing magnetic field to a free layer is not disposed. In a magnetic head which employs the structure disclosed in the above cited article and JP-A-2001-68759, since the antiferromagnetic layer is laminated on the magneto-resistive layer as a magnetic domain control layer for applying a biasing magnetic field to the free layer, an insulating layer made of $Al_2O_3$ or $SiO_2$ is formed not only near an end face of the magneto-resistive layer but also over a region far away from the end face over the entire periphery other than the side of the magneto-resistive layer closer to the magnetic recording medium side (ABS side). Therefore, the magnetic head which employs the structures disclosed in the above cited article and JP-A-2001-68759 does not have a soft magnetic layer having a magnetic shield effect on both sides of the magneto-resistive layer in the track width direction.

In any of the conventional magnetic heads described above, the magneto-resistive layer is disposed near the surface of the magnetic head closer to the magnetic recording medium without employing a yoke member for leading a magnetic field from a magnetic recording medium to the magneto-resistive layer, so that the track width direction is substantially parallel with the film surface of the magneto-resistive layer.

In the conventional magnetic heads described above, since a hard magnetic layer or an insulating layer made of $Al_2O_3$ or $SiO_2$ is simply disposed on both sides of the magneto-resistive layer in the track width direction, this structure causes side-reading, thereby making it difficult to narrow the track width for increasing a recording density.

Further, in the conventional CCP-based head such as the TMR head, the magneto-resistive layer is supplied with a current through an upper electrode and a non-magnetic metal layer (cap layer), so that a good electrical contact must be maintained between the upper electrode and non-magnetic metal layer to reduce the resistance. However, when the base formed with the magneto-resistive layer and non-magnetic metal layer is left in the atmosphere, the surface of the non-magnetic metal layer is oxidized in the air. Even if a material insusceptible to oxidization is used for the non-magnetic metal layer, a slight oxide film or surface adsorption layer is inevitable. Thus, if another layer such as an upper electrode is formed on the oxidized non-magnetic metal layer, a good electrical contact cannot be maintained between the upper electrode and non-magnetic metal layer. To solve this inconvenience, the surface oxide film is removed from the non-magnetic metal layer by dry etching (such as sputter etching, ion beam etching or the like) within the same vacuum chamber in which the upper electrode and the like are deposited, prior to the formation of another layer such as the upper electrode on the non-magnetic metal layer.

However, when the surface oxide film is fully dry etched for a lower resistance during a removing step, the magneto-resistive layer is seriously damaged by an ion beam. For example, with the TMR head, an extremely thin tunnel barrier layer (for example, 1 mm or less in thickness) is seriously damaged by the ion beam to cause an extreme reduction in MR ratio and occasional failure in a utilization as a magnetic head.

SUMMARY OF THE INVENTION

It is an object of the present invention to provide a magnetic head which is capable of reducing the side-reading to narrow the track width for increasing a recording density, as well as to provide a head suspension assembly and a magnetic disk apparatus using the magnetic head.

It is another object of the present invention to provide a magnetic head which is simple in structure and easy to manufacture but is capable of simultaneously achieving both advantages of: (a) reducing the side-reading to narrow the track width for increasing a recording density; and (b) removing a surface oxide film on a non-magnetic metal layer to reduce the resistance while limiting a damage caused by an ion beam to eventually improve the characteristic of the device, as well as to provide a head suspension assembly and a magnetic disk apparatus using the magnetic head.

A magnetic head according to a first aspect of the present invention includes a base, and a magneto-resistive device supported by the base. The magneto-resistive device has a magneto-resistive layer formed on one surface of the base, and including a free layer, and a first film formed to be in contact with an effective region effectively involved in detection of magnetism in the magneto-resistive layer on at least both sides or at least one side of the effective region in a track width direction without overlapping with the effective region. The track width direction is substantially parallel to a film surface of the magneto-resistive layer. The first film is a single-layer film or a multiple-layer film. The first film includes a soft magnetic layer which does not form part of a layer for applying a biasing magnetic field to the free layer.

A material suitable for the soft magnetic layer may be, for example, permalloy (NiFe), CoZrNb, FeN, sendust (Fe-AlSi), and the like.

In the first aspect, since the track width direction is substantially parallel to the film surface of the magneto-resistive layer, the magnetic head according to the first aspect does not employ a yoke member for leading a magnetic field from a magnetic recording medium to the magneto-resistive layer. The magneto-resistive layer is generally positioned near the surface of the magnetic head closer to the magnetic recording medium.

According to the first aspect, the magnetic head has the first film disposed as mentioned above, and the first layer includes the soft magnetic layer which does not form part of a layer for applying a biasing magnetic field to the free layer. Thus, the soft magnetic layer acts as a shield layer for reducing side-reading, so that the resulting reduction in side-reading permits a narrower track width for a higher recording density.

Incidentally, the result of a research made by the inventors revealed that there is a path which accesses an end face of a magneto-resistive layer (for example, an end face of a tunnel barrier layer in a TMR head), as a path which gives an ion beam damage to the magneto-resistive layer during the aforementioned surface oxide film removing step. It was also revealed that in a conventional magneto-resistive device, an ion beam damage reduction effect is low in an insulating layer made of $Al_2O_3$ or $SiO_2$ disposed near a predetermined end face of the magneto-resistive layer, and the ion beam damage is problematic particularly from the end face. Based on such new knowledge, the inventors conceived a reduction in the ion beam damage to the magneto-resistive layer by disposing a material having a higher ion beam damage reduction effect than $Al_2O_3$ and $SiO_2$ on this path, and confirmed the effect by experiments. Though the experiments were made using Ta instead of a soft magnetic material for the aforementioned material, the soft magnetic material can be used instead of Ta for enhancing the ion beam damage reduction effect from the fact that constituent elements of the soft magnetic material has the atomic weight larger than that of constituent elements of $Al_2O_3$ and $SiO_2$, just like the constituent elements of Ta having the atomic weight larger than that of constituent elements of $Al_2O_3$ and $SiO_2$.

Now, description will be made on how to determine whether a material has a high or low ion beam damage reduction effect. Two layers are formed of two materials in the same thickness, respectively. Each of the layers is formed on one side with a layer of interest (for example, a tunnel barrier layer) which can be damaged by ion beams to cause a problem. When the two layers made of the two materials are irradiated with an ion beam having the same energy directly or through the same predetermined layer from the side opposite to the layer of interest, the material on which the layer of interest remains undamaged or which is less susceptible to degradation of characteristics is said to have a higher ion beam damage reduction effect than the other material. Generally, it is thought that a material including an element having larger atomic weight has a higher ion beam damage reduction effect. It is thought that the ion beam damage occurs in the following manner: an ion beam such as Ar passes through the material and directly accesses the layer of interest to destroy the layer of interest, or the energy of the ion beam propagates through a crystal lattice in the form of lattice vibration to destroy the layer of interest, or the atoms in crystals within the material transmit the energy of the ion beams in a pileup fashion to destroy the layer of interest.

As mentioned above, the soft magnetic material has a higher ion beam damage reduction effect than $Al_2O_3$ and $SiO_2$. Thus, the soft magnetic layer is formed in the relationship as mentioned above in the first aspect, so that the magnetic head according to the first aspect of the present invention can reduce a damage caused by an ion beam which accesses at least a part of region of the end face of the effective region of the magneto-resistive layer, as compared with the conventional magnetic head which simply has an $Al_2O_3$ or an $SiO_2$ layer formed as an insulating layer without hard magnetic layers and the like formed on both sides of the effective region in the track width direction. Consequently, according to the first aspect, in addition to the advantage of reducing the side-reading, it is possible to simultaneously provide an advantage of removing a surface oxide film to reduce the resistance, while reducing the ion beam damage, to eventually improve the characteristics of the device, when the present invention is applied to a magnetic head of a type which does not have a hard magnetic layer and the like on both sides of the effective region in the track width direction. In this event, since the soft magnetic layer contributes to the simultaneous accomplishment of the two advantages, the resulting magnetic head can be simple in structure and easy to manufacture, as compared with a magnetic head which is formed with a special layer for reducing the ion beam damage.

In a magnetic head according to a second aspect of the present invention, the effective region is a region in which a current flows in a direction substantially perpendicular to the film surface in the magneto-resistive layer, in the first aspect.

The second aspect represents an example of a magnetic head which employs the CPP structure. Since the CPP structure involves dry etching for removing a surface oxide film as mentioned above, a reduction in an ion beam damage by the soft magnetic layer exhibits a large technical significance.

In a magnetic head according to a third aspect of the present invention, the first film includes an insulating layer positioned closest to the base, in the second aspect.

In the third aspect, since the layer of the first film Closest to the base is an insulating layer, the soft magnetic layer will not cause electric short-circuiting between constituent layers of the magneto-resistive layer.

In a magnetic head according to a fourth aspect of the present invention, the magneto-resistive layer includes a tunnel barrier layer formed on one surface side of the free layer, a pinned layer formed on one surface side of the tunnel barrier layer opposite to the free layer, and a pin layer formed on one surface side of the pinned layer opposite to the tunnel barrier layer, wherein the first film is in contact with an end face of the tunnel barrier layer, in the second or third aspect.

The fourth aspect represents an example in which the second and third aspects are applied to a TMR head. In the TMR device, as the tunnel barrier layer is made extremely thin in order to reduce the resistance of the magneto-resistive layer itself, the influence of the damage by an ion beam is significant. Therefore, when the second and third aspects are applied to a TMR head as shown in the fourth aspect, resulting effects are remarkable. However, the second and third aspects are not limited to the TMR head but can be applied as well to a CPP-GMR head and the like.

In a magnetic head according to a fifth aspect of the present invention, the effective region is a region in which a current flows in a direction substantially parallel to the film surface in the magneto-resistive layer, in the first aspect.

The fifth aspect represents an example of a magnetic head which employs the CIP structure. In the fifth aspect, as the soft magnetic layer is additionally functioned as a lead layer for leading a sense current, the resulting magnetic head can sufficiently reduce the side reading while preventing a reduction in head output by increasing the thickness of the soft magnetic layer, even if the MR height is reduced as required for a higher recording density.

In a magnetic head according to a sixth aspect of the present invention, the magneto-resistive layer includes a non-magnetic metal layer formed on one surface side of the free layer, a pinned layer formed on one surface side of the non-magnetic metal layer opposite to the free layer, and a pin layer formed on one surface side of the pinned layer opposite to the non-magnetic metal layer, in any of the second, third and fifth aspects. The sixth aspect represents an example in which any of the second, third and fifth aspects is applied to a GMR head.

A magnetic head according to a seventh aspect of the present invention further includes, in any of the first to sixth aspects, a layer for applying a biasing magnetic field to the free layer such that the layer overlaps with the effective region. In the seventh aspect, since the layer for applying a biasing magnetic field overlaps with the effective region, the resulting structure is referred to as a "piled bias structure."

In a magnetic head according to an eighth aspect of the present invention, the first film includes a layer for applying a biasing magnetic field to the free layer in any of the first to sixth aspects. The eight aspect represents an example of a magnetic head which employs the abutted structure.

In the first to sixth aspects, the layer (bias layer) for applying a biasing magnetic field to the free layer may or may not be included in the first layer, as in the seventh and eighth aspects. However, a magnetic head which employs the piled bias structure as in the seventh aspect does not need bias layers on both sides of the magneto-resistive device irrespective of whether the magnetic head employs the CIP structure or CPP structure, so that the device can be surrounded by the soft magnetic material. Thus, the present invention provides larger benefits for the magnetic head which employs the piled bias structure as in the seventh aspect than for a magnetic head which employs the abutted structure as in the eighth aspect.

In a magnetic head according to a ninth aspect of the present invention, the first film is in contact with the effective region as well on a side of the effective region opposite to a magnetic recording medium in any of the first to eighth aspects.

As described above, both in conventional magnetic heads which employ the abutted structure and in conventional magnetic heads which employ the structures disclosed in the aforementioned article and JP-A-2001-68759, an insulating layer made of $Al_2O_3$ or $SiO_2$ is disposed not only near the end face of the magneto-resistive layer but also over a region quite far away from the end face on the side of the magneto-resistive layer opposite to the magnetic recording medium (ABS side). The magnetic head according to the ninth aspect is quite effective because it can reduce the ion beam damage through the path to the end face of the magnetic metal layer opposite to the magnetic recording medium. In addition, no special layer is formed for reducing the ion beam damage through that path, but the first film can be collectively formed in that region, in which case the manufacturing is further facilitated.

A head suspension assembly according to a tenth aspect of the present invention includes the magnetic head according to any of the first to ninth aspects, and a suspension for supporting the head mounted near a leading end thereof.

According to the tenth aspect, since the head suspension assembly employs the magnetic head according to any of the first to ninth aspects, it is possible to increase the recording density of a magnetic disk apparatus and the like.

A magnetic disk apparatus according to an eleventh aspect of the present invention includes the head suspension assembly according to the tenth aspect, an arm for supporting the head suspension assembly, and an actuator for moving the arm to position the magnetic head.

According to the eleventh aspect, since the magnetic apparatus employs the head suspension assembly according to the tenth aspect, it is possible to increase the recording density.

BRIEF DESCRIPTION OF THE DRAWINGS

FIG. 18 is a diagram schematically illustrating a further step which makes up the wafer process in the method of manufacturing the magnetic head illustrated in FIGS. 10 to 14;

FIG. 20 is a diagram schematically illustrating a step which makes up a wafer process in a method of manufacturing a magnetic head according to a comparative example;

DETAILED DESCRIPTION OF THE EMBODIMENTS

In the following, a magnetic head, and a head suspension assembly and a magnetic disk apparatus using the magneto-resistive device according to the present invention will be described with reference to the accompanying drawings.

First, a magnetic head according to a first embodiment of the present invention will be described with reference FIGS. 1 to 5.

Figure 1:
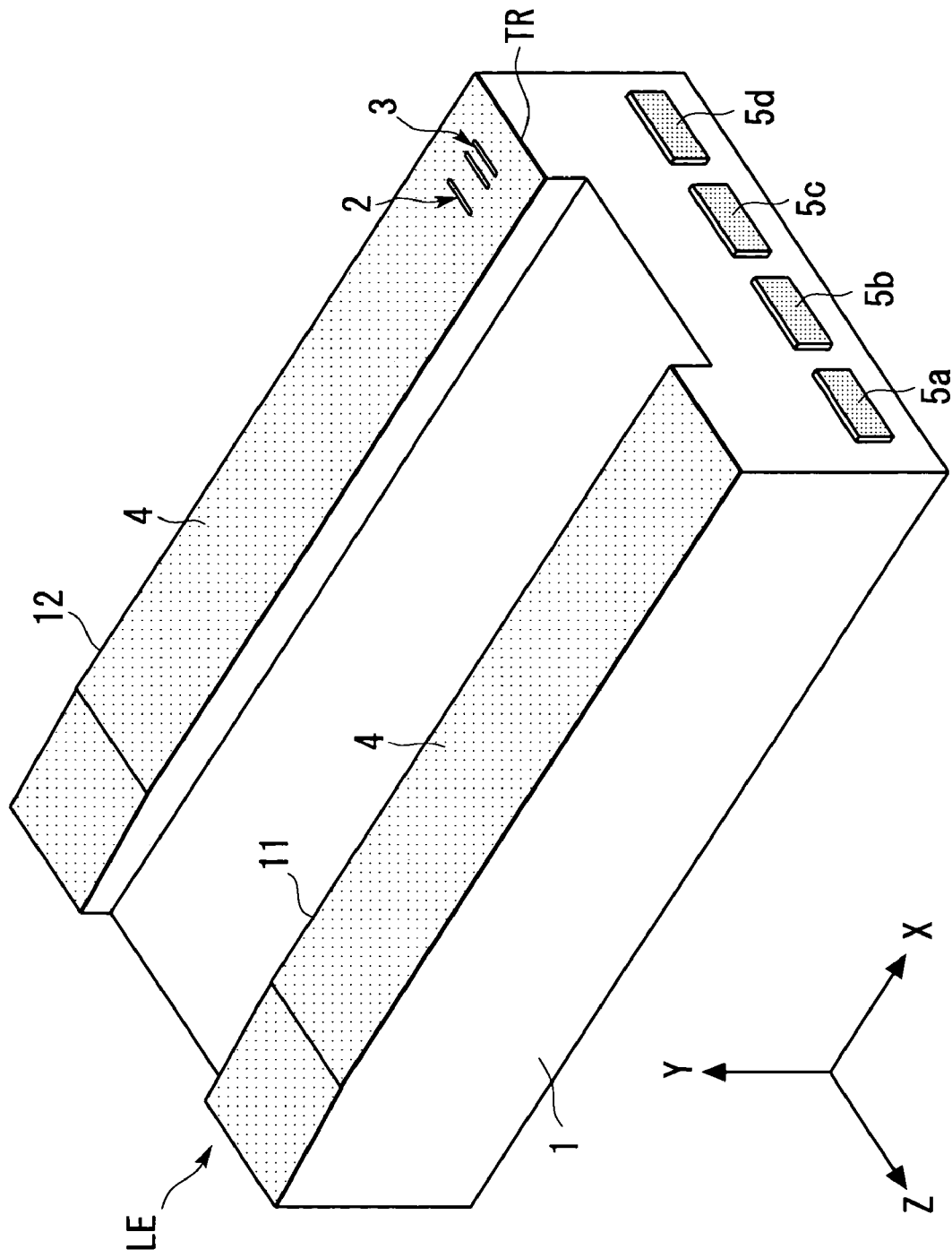
FIG. 1 is a general perspective view schematically illustrating a magnetic head according to a first embodiment of the present invention.
Figure 2:
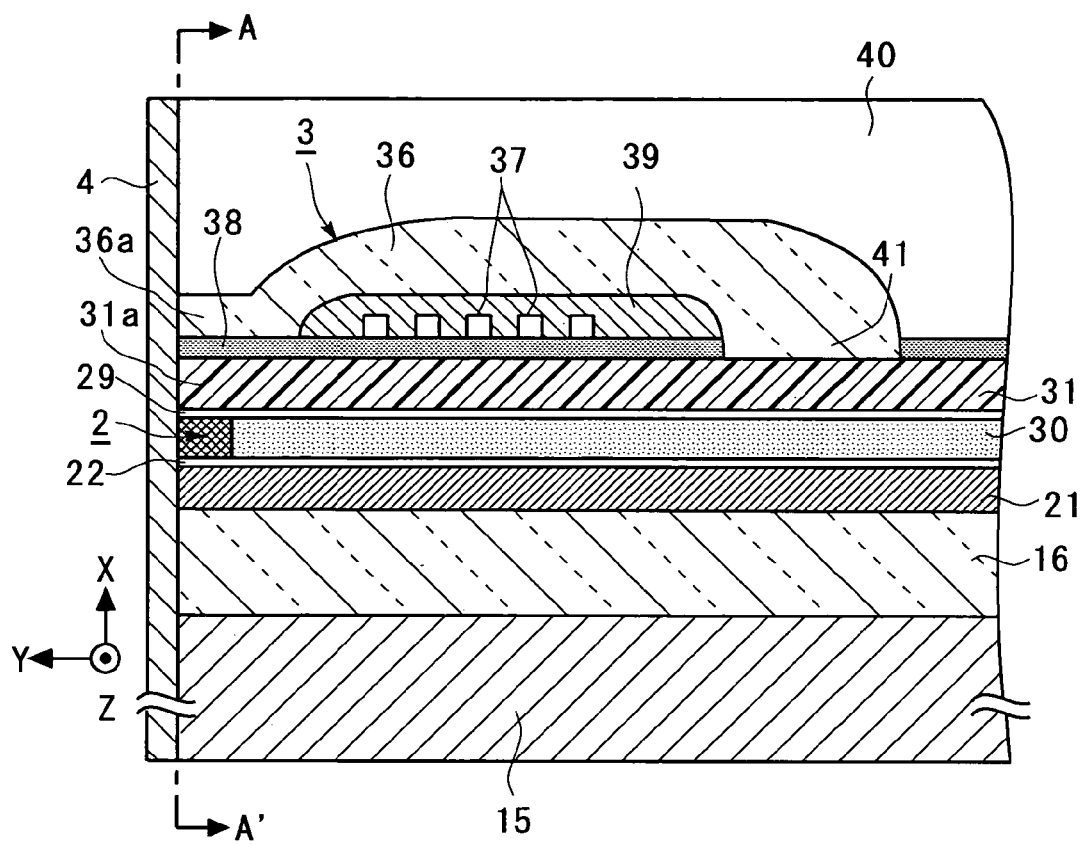
FIG. 2 is an enlarged cross-sectional view schematically illustrating a portion of a TMR device and an inductive magnetic transducing device in the magnetic head illustrated in FIG. 1.
Figure 3:
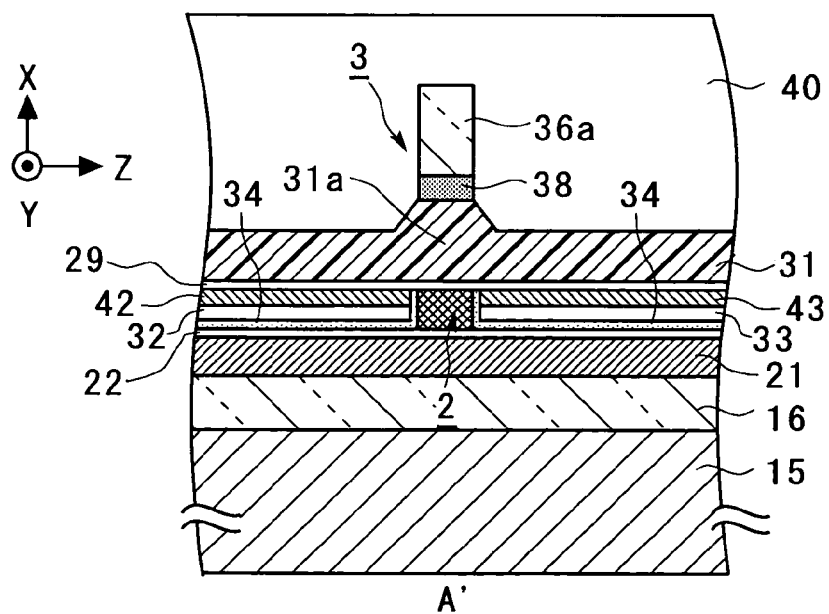
FIG. 3 is a general sectional view taken along a line A-A' indicated by arrows in FIG. 2.
Figure 4:
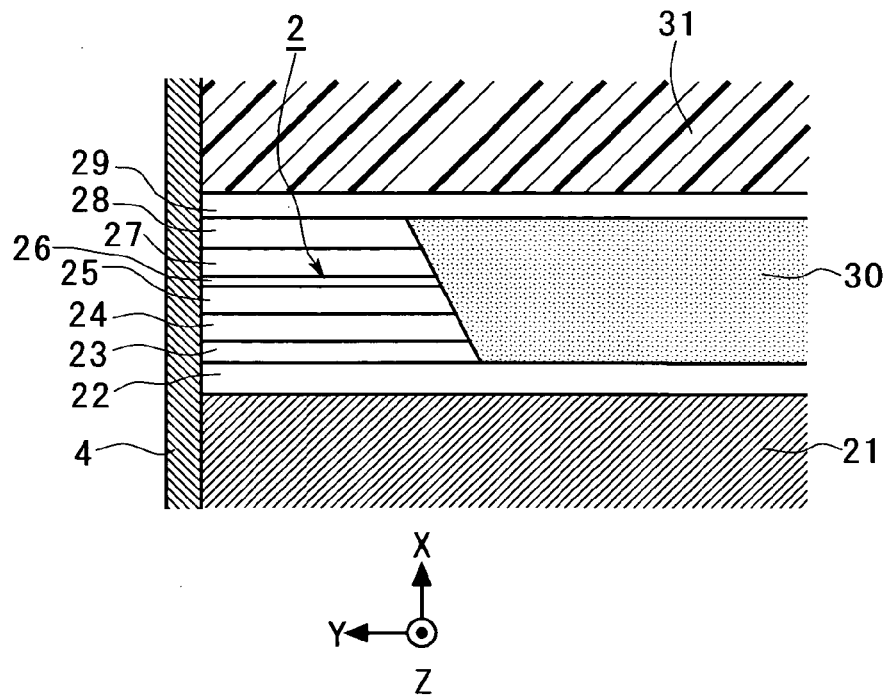
FIG. 4 is a further enlarged view around the TMR device in FIG. 2.
Figure 5:
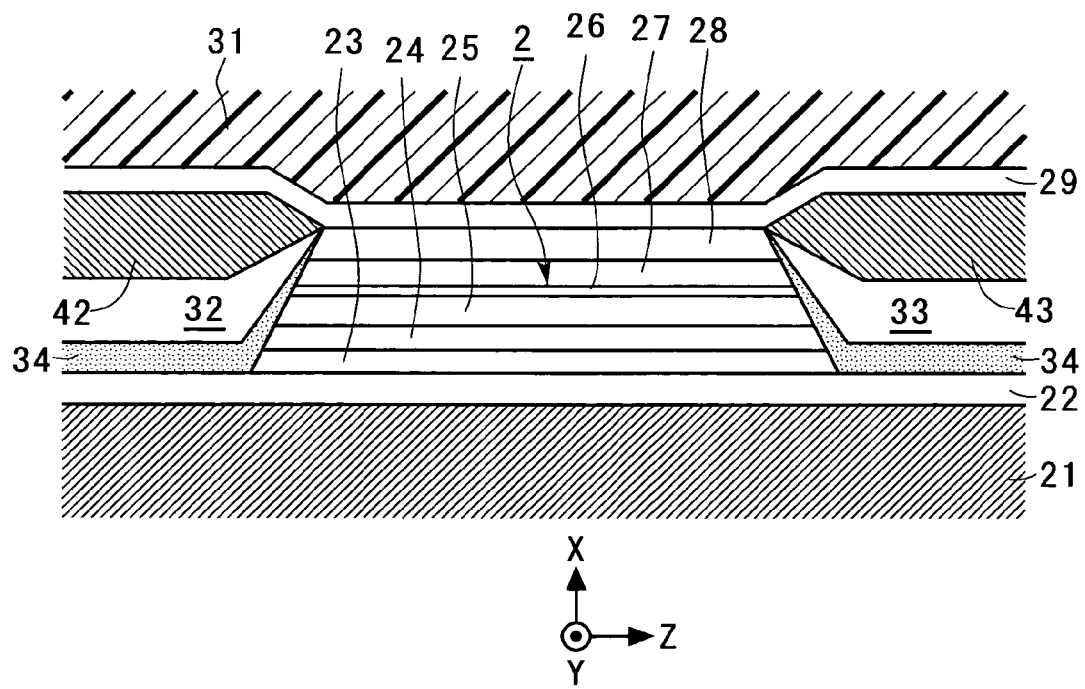
FIG. 5 is a further enlarged view around the TMR device in FIG. 3.

FIG. 1 is a general perspective view schematically illustrating the magnetic head according to the first embodiment of the present invention. FIG. 2 is an enlarged cross-sectional view schematically illustrating a portion of a TMR device 2 and an inductive magnetic transducing device 3 in the magnetic head illustrated in FIG. 1. FIG. 3 is a general sectional view taken along a line A-A' indicated by arrows in FIG. 2. FIG. 4 is a further enlarged view illustrating around the TMR device 2 in FIG. 2. FIG. 5 is a further enlarged view around the TMR device 2 in FIG. 3. For facilitating the understanding, an X-axis, a Y-axis and a Z-axis, orthogonal to one another, are defined as shown in FIGS. 1 to 5 (the same applies to figures later described). The Z-axis direction indicated by the arrow is referred to as the "+Z-direction" or "+Z-side," and the opposite direction is referred to as the "−Z-direction" or "−Z-side." The same is applied to the X-axis direction and Y-axis direction. The X-axis direction is the same as a direction in which a magnetic recording medium is moved. The Z-axis direction is the same as a track width direction of the TMR device 2.

As illustrated in FIG. 1, the magnetic head according to the first embodiment comprises a slider 1 as a base; the TMR device 2 as a magneto-resistive device for use as a magnetic head device for reproduction; an inductive magnetic transducing device 3 as a magnetic head device for recording; and a protection film 4 made of a DLC film or the like, and is configured as a composite magnetic head. However, the magnetic head according to the present invention may comprise only the TMR device 2. Also, while the magnetic head of the first embodiment comprises one each of the devices 2, 3, the numbers of these devices are not limited in any sense.

The slider 1 has rails 11, 12 on a surface opposite to a magnetic recording medium, and the surfaces of the rails 11, 12 define air bearing surfaces (ABS). In the example illustrated in FIG. 1, there are two rails 11, 12, but the number of rails is not limited to two. For example, the slider 1 may have one to three rails, or the ABS may be a flat surface without rails. In addition, the ABS may be formed with a variety of geometric shapes for improving a floating characteristic and the like. The magnetic head according to the present invention may have any type of slider.

In the first embodiment, the protection film 4 is applied only on the surfaces of the rails 11, 12, so that the surface of the protection film 4 defines the ABS. Actually, the protection film 4 may be applied on the entire surface of the slider 1 opposite to a magnetic recording medium. While the protection film 4 is preferably provided, the protection film 4 may not be necessarily provided.

The TMR device 2 and inductive magnetic transducing device 3 are disposed on the rail 12 near an air outlet end TR, as illustrated in FIG. 1. A direction in which a recording medium is moved is identical to the X-axis direction in FIG. 1, and also identical to a direction in which air flows when the magnetic recording medium is rapidly moved. Air enters from an air inlet end LE and exits from the air outlet end TR. The slider 1 is provided on an end face of the air outlet end TR with bonding pads 5a, 5b connected to the TMR device 2, and bonding pads 5c, 5d connected to the inductive magnetic transducing device 3.

As illustrated in FIGS. 2 and 3, the TMR device 2 and inductive magnetic transducing device 3 are laminated on an underlying layer 16 deposited on a ceramic base 15 which constitutes the slider 1. The ceramic base 15 is generally made of AlTiC ($Al_2O_3$—TiC), SiC or the like.

When $Al_2O_3$—TiC is used, an insulating film made, for example, of $Al_2O_3$ is used for the underlying layer 16 since $Al_2O_3$—TiC is electrically conductive. The underlying layer 16 may not be provided in some cases.

As illustrated in FIGS. 4 and 5, the TMR device 2 comprises a lower electrode 21 formed on the underlying layer 16; an upper electrode 31 formed overlying the lower electrode 21 (opposite to the base 15); and a lower metal layer (lower layer) 22, a lower metal layer (upper layer) 23, a pin layer 24, a pinned layer 25, a tunnel barrier layer 26, a free layer 27, and an upper metal layer (cap layer) 28 as a non-magnetic metal layer which serves as a protection layer, and an upper metal layer 29 as an underlying layer of the upper electrode 31, which are laminated in this order from the lower electrode 21 between the electrodes 21, 31. The pin layer 24, pinned layer 25, tunnel barrier layer 26 and free layer 27 constitute a magneto-resistive layer. This magneto-resistive layer is disposed near the surface of the magnetic head closer to the magnetic recording medium, such that the Z-axis direction (track width direction) is substantially parallel with the film surface of the magneto-resistive layer. While the actual TMR device 2 typically has a laminate structure composed of a larger number of layers, rather than the laminate structure composed of the number of layers as illustrated, the illustrated magnetic head represents a laminate structure minimally required for the basic operation of the TMR device 2 for simplifying the description.

In the first embodiment, the lower electrode 21 and upper electrode 31 are additionally used as a lower magnetic shield and an upper magnetic shield, respectively. The electrodes 21, 31 are formed of a magnetic material, for example, NiFe or the like. Though not shown, these electrodes 21, 31 are electrically connected to the aforementioned bonding pads 5a, 5b, respectively. It should be understood that a lower magnetic shield and an upper magnetic shield may be provided in addition to the lower electrode 21 and upper electrode 31.

The lower metal layer 22 is an electrically conductive material which is comprised, for example, of a Ta layer or the like. The lower metal layer 23 is an electrically conductive material which is comprised, for example, of an NiFe layer or the like. In the first embodiment, The lower metal layer 23 is formed only coextensively to the magneto-resistive layer, while the lower metal layer 22 widely extends over the electrode 21. Alternatively, the lower metal layer 23 may also be extended widely, or the lower metal layer 22 may be formed only coextensively to the magneto-resistive layer.

The pin layer 24, which is comprised of a antiferromagnetic layer, is preferably formed, for example, of an Mn-based alloy such as PtMn, IrMn, RuRhMn, FeMn, NiMn, PdPtMn, RhMn, CrMnPt, or the like. The pinned layer 25 and free layer 27 are each comprised of a ferromagnetic layer formed of such a material as Fe, Co, Ni, FeCo, NiFe, CoZrNb, FeCoNi, or the like. The pinned layer 25 has its magnetization direction fixed in a predetermined direction by an exchange bias magnetic field between the pinned layer 25 and the pin layer 24. On the other hand, the free layer 27 freely varies its magnetization direction in response to an external magnetic field which is basically magnetic information. In the first embodiment, the pin layer 24, pinned layer 25, tunnel barrier layer 26 and free layer 27 are laminated in this order from the lower electrode 21. Alternatively, the free layer 27, tunnel barrier layer 26, pinned layer 25 and pin layer 24 may be laminated in this order from the lower electrode 21. The tunnel barrier layer 26 is formed, for example, of a material such as $Al_2O_3$, NiO, GdO, MgO, $Ta_2O_5$, $MoO_2$, $TiO_2$, $WO_2$, or the like.

The upper metal layer (non-magnetic metal layer) 28, serving as a cap layer, is formed of a monolayer film or a multilayer film made of simple Ta, Rh, Ru, Os, W, Pd, Pt, or Au, or an alloy made up of two or more of these elements in combination. The thickness of the upper metal layer 28 preferably is chosen to be 7 nm or more. The upper metal layer 28 having the thickness of 7 nm or more can reduce a damage to the magneto-resistive layer when an oxide film on the surface of the upper metal layer 28 is removed by dry etching in a manufacturing process. In the first embodiment, the upper metal layer 28 is milled together with the layers 23-27 during the manufacturing, as described later, so that the upper metal layer 28 substantially exactly overlaps with the layers 23-27.

The upper metal layer 29, serving as the underlying layer of the upper electrode 31, is made of an electrically conductive material formed of a non-magnetic metal such as Ta or the like. In the first embodiment, the upper metal layer 29 is provided for holding a magnetic shield gap (a gap between the electrodes 21, 31) of a desired dimension. However, the upper metal layer 29 may not be provided.

As illustrated in FIGS. 3 and 5, hard magnetic layers 32, 33 are formed on both sides of the magneto-resistive layer in the Z-axis direction as magnetic domain control layers for applying a biasing magnetic field to the free layer 27 for magnetic domain control. The hard magnetic layers 32, 33 are formed, for example, of a material such as Cr/CoPt (cobalt platinum alloy), Cr/CoCrPt (cobalt chromium platinum alloy), TiW/CoPt, TiW/CoCrPt, or the like. An insulating layer 34 made of $Al_2O_3$ or the like is formed under these hard magnetic layers 32, 33. The insulating layer 34 also intervenes between end faces of the hard magnetic layers 32, 33 and layers 23-28, such that the layers 23-28 are not electrically short-circuited by the hard magnetic layers 32, 33.

Also, as illustrated in FIGS. 3 and 5, soft magnetic layers 42, 43 are formed on the hard magnetic layers 32, 33, respectively, on both sides of the magneto-resistive layer in the Z-axis direction. The soft magnetic layers 42, 43 do not form part of the layer which applies a biasing magnetic field to the free layer 27. Materials suitable for the soft magnetic layers 42, 43 may include, for example, permalloy (NiFe), CoZrNb, FeN, sendust (FeAlSi), and the like.

In the first embodiment, the layers 34, 32, 42 and layers 34, 33, 43 on both sides of the magneto-resistive layer in the Z-axis direction constitute a film which is formed to be in contact with an effective region effectively involved in detection of magnetism in the magneto-resistive layer (in the first embodiment, a region in which a current flows in a direction substantially perpendicular to the film surface in the magneto-resistive layer) on both sides of the effective region in the track width direction (Z-axis direction) without overlapping with the effective region.

As illustrated in FIGS. 2 and 4, an insulating layer 30 made of $Al_2O_3$ or the like is formed between the lower metal layer 22 and upper metal layer 29 in a region in which the layers 32, 42 and layers 33, 43 are not formed.

Specific examples of the compositions of main layers mentioned above are shown in Table 1 below.

TABLE 1

| Name of Layer and Reference Numeral in Drawings | Composition and Thickness of Layer (When composed of two layers or more, a layer more to the left is positioned lower (near the substrate)) |
| --- | --- |
| Upper Electrode 31 (serving also as Upper Magnetic Shield) | NiFe(2 μm) |
| Upper Metal Layer 29 | Ta(3 nm) |
| Insulating Layer 30 | $Al_2O_3$(60 nm) |
| Soft Magnetic Layers 42, 43 | NiFe(40 nm) |
| Hard Magnetic Layers 32, 33 | TiW(5 nm)/CoPt(25 nm)/Ta(2 nm) |
| Insulating Layer 34 | $Al_2O_3$(10 nm) |
| Upper Metal Layer 28 (Cap Layer) | Ta(25 nm) |
| Free Layer 27 | CoFe(1 nm)/NiFe(3 nm) |
| Tunnel Barrier Layer 26 | $Al_2O_3$(0.6 nm) |
| Pinned Layer 25 | CoFe(2 nm)/Ru(0.8 nm)/CoFe(3 nm) |
| Pin layer 24 | PtMn(15 nm) |
| Lower Metal Layer 23 | NiFe(2 nm) |
| Lower Metal Layer 22 | Ta(5 nm) |
| Lower Electrode 21 (serving also as Lower Magnetic Shield) | NiFe(2 μm) |

As illustrated in FIGS. 2 and 3, the inductive magnetic transducing device 3 has the upper electrode 31 which is additionally used as a lower magnetic layer for the device 3; an upper magnetic layer 36; a coil layer 37; a write gap layer 38 made of alumina or the like; an insulating layer 39 made of an organic resin such as a novolac resin, a protection layer 40 made of alumina or the like, and the like. NiFe, FeN or the like, for example, is used as a material for the magnetic layer 36. Leading ends of the upper electrode 31, which is additionally used as the lower magnetic layer, and the upper magnetic layer 36 are formed as a lower pole 31a and an upper pole 36a which oppose each other through the write gap layer 38 made of alumina or the like in an infinitesimal thickness. The lower pole 31a and upper pole 36a write information on a magnetic recording medium. The upper electrode 31, which is additionally used as the lower magnetic layer, and the upper magnetic layer 36 are coupled to each other at a joint 41 at which a yoke is opposite to the lower pole 31a and upper pole 36a so as to complete a magnetic circuit. Within the insulating layer 39, a coil layer 37 is formed such that it is spirally wound around the joint 41 of the yoke. The coil layer 37 has both ends electrically connected to the bonding pads 5c, 5d. The coil layer 37 is arbitrary in the number of turns and the number of layers. Also, the inductive magnetic transducing device 3 may be arbitrary in structure. The upper electrode 31 may be divided into two parts by an insulating layer made of $Al_2O_3$, $SiO_2$ or the like in order to separate the roles of the lower magnetic layer of the inductive magnetic transducing device 3 and the upper electrode of the TMR device 2.

Next, description will be made on an exemplary method of manufacturing the magnetic head according to the first embodiment.

First, a wafer process is performed. Specifically, a wafer 101 made of $Al_2O_3$—TiC, SiC or the like is provided for making a base 15. Using the thin film forming technology and the like, the aforementioned layers are formed in a large number of magnetic head forming regions in matrix on the wafer 101 to provide the aforementioned structure.

Figure 7A:
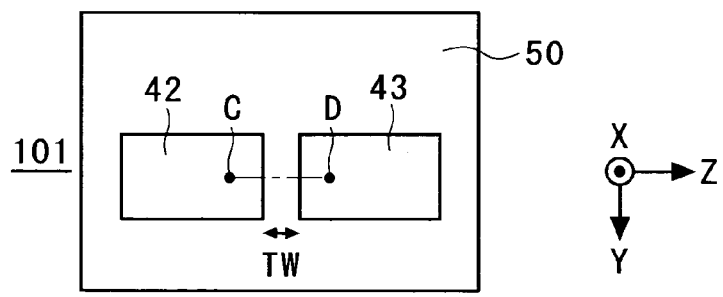
FIGS. 7A and 7B are diagrams schematically illustrating a further step which makes up the wafer process in the method of manufacturing the magnetic head illustrated in FIGS. 1 to 5.
Figure 7B:
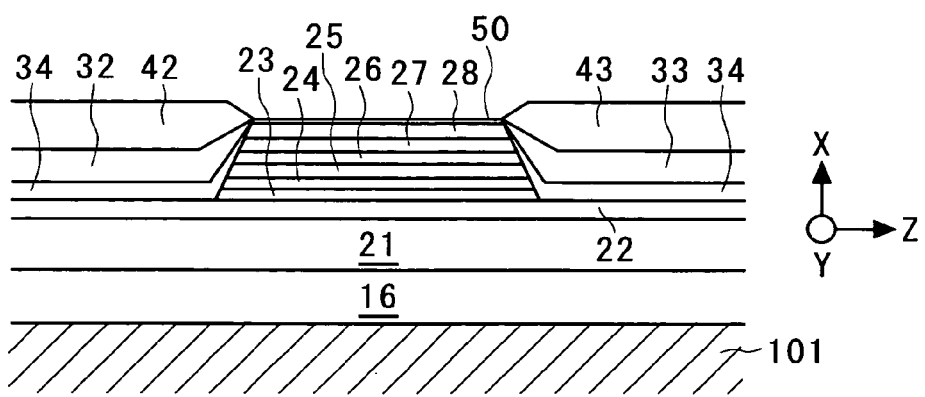
Figure 8A:
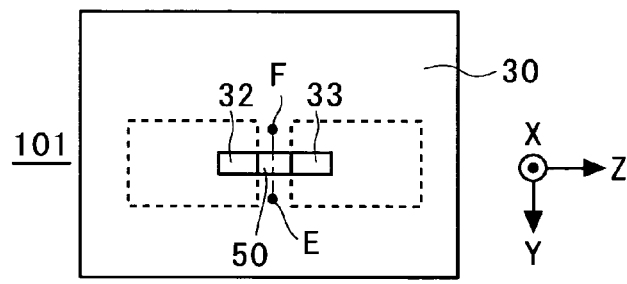
FIGS. 8A and 8B are diagrams schematically illustrating a further step which makes up the wafer process in the method of manufacturing the magnetic head illustrated in FIGS. 1 to 5.
Figure 8B:
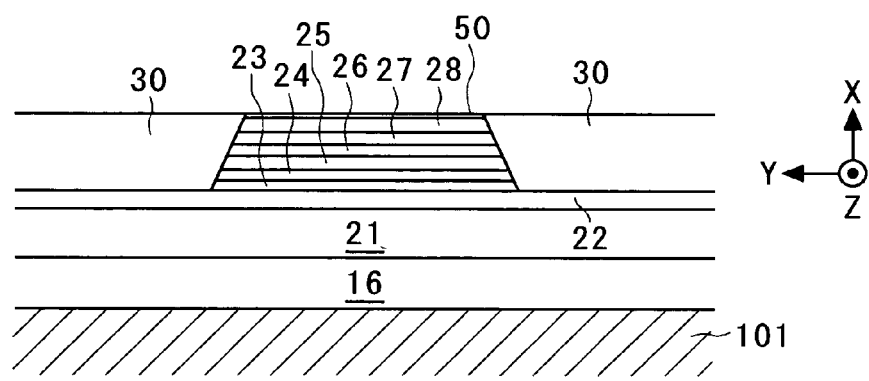

The outline of the wafer process will be described with reference to FIGS. 6 to 9. FIGS. 6 to 9 are diagrams schematically illustrating respective steps which make up the wafer process, wherein FIGS. 6A, 7A, 8A, and 9A are general plan views, respectively; FIG. 6B is a general cross-sectional view taken along a line C-D in FIG. 6A; FIG. 7B is a general cross-sectional view taken along a line C-D in FIG. 7A; FIG. 8B is a general cross-sectional view taken along a line E-F in FIG. 8A; and FIG. 9B is a general cross-sectional view taken along a line E-F in FIG. 9A. In FIG. 7A, TW indicates the width of a track defined by the TMR device 2.

Figure 6A:
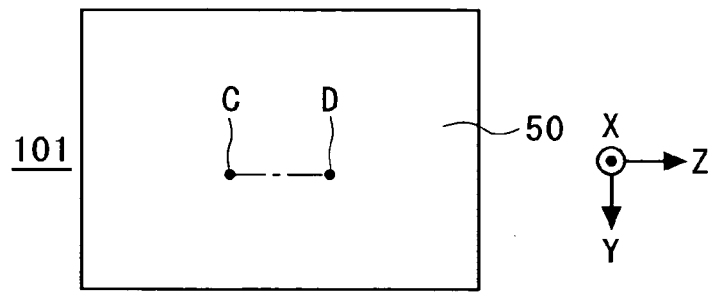
FIGS. 6A and 6B are diagrams schematically illustrating a step which makes up a wafer process in a method of manufacturing the magnetic head illustrated in FIGS. 1 to 5.
Figure 6B:
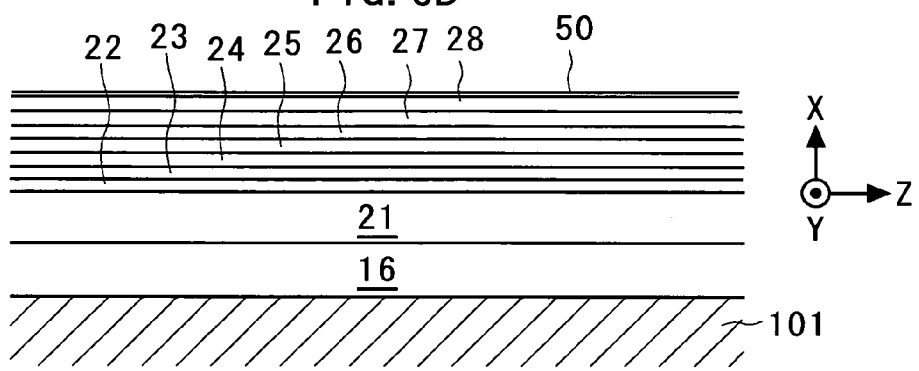

First, in the wafer process, the underlying layer 16, lower electrode 21, lower metal layer 22, lower metal layer 23, pin layer 24, pinned layer 25, tunnel barrier layer 26, free layer 27, and upper metal layer 28 are sequentially laminated on the wafer 101 (FIGS. 6A and 6B). In this event, the lower electrode 21 is formed, for example, by a plating method, while the other layers are formed, for example, by a sputtering method. The upper metal layer 28 is formed in a predetermined thickness such that the thickness of the upper metal layer 28 remains 7 nm or more after dry etching for removing the surface oxide film described later. Subsequently, the substrate in this state is once left in the atmosphere. In this event, the top face of the magneto-resistive layer (top face of the free layer 27 in the first embodiment) is protected by the upper metal layer 28, so that it is not oxidized. However, an oxide film 50 is formed on the top face of the upper metal layer 28 (FIGS. 6A and 6B).

Next, the lower metal layer 23, the pin layer 24, pinned layer 25, tunnel barrier layer 26, free layer 27, upper metal layer 28 and oxide film 50 are partially removed by first ion milling. Next, the insulating layer 34, hard magnetic layers 32, 33 and soft magnetic layers 42, 43 are formed in the removed portions by a lift-off method (FIGS. 7A and 7B).

Next, the lower metal layer 23, pin layer 24, pinned layer 25, tunnel barrier layer 26, free layer 27, upper metal layer 28, oxide film 50, soft magnetic layers 42, 43, hard magnetic layers 32, 33, and insulating layer 34 are partially removed while leaving a strip portion which has a necessary width (width in the Y-axis direction) with respect to the height direction of the TMR device 2, and extends in the Z-axis direction by a predetermined distance. Next, the insulating layer 30 is formed in the removed portions by a lift-off method (FIGS. 8A and 8B).

Next, the oxide film 50 formed on the top face of the upper metal layer 28 is removed by dry etching such as sputter etching, ion beam etching or the like in the same vacuum chamber in which the upper metal layer 29 is formed. In this event, since the upper metal layer 28 is formed in a relatively large thickness of 7 nm or more, the upper metal layer 28 reduces a damage to the tunnel barrier layer 26 by ion beam which is passing along a path that passes through the upper metal layer 28.

Figure 9A:
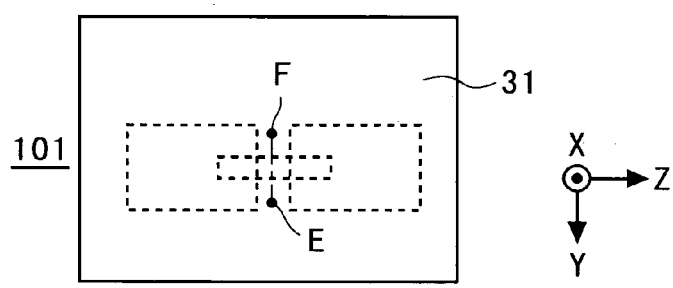
FIGS. 9A and 9B are diagrams schematically illustrating a further step which makes up the wafer process in the method of manufacturing the magnetic head illustrated in FIGS. 1 to 5.
Figure 9B:
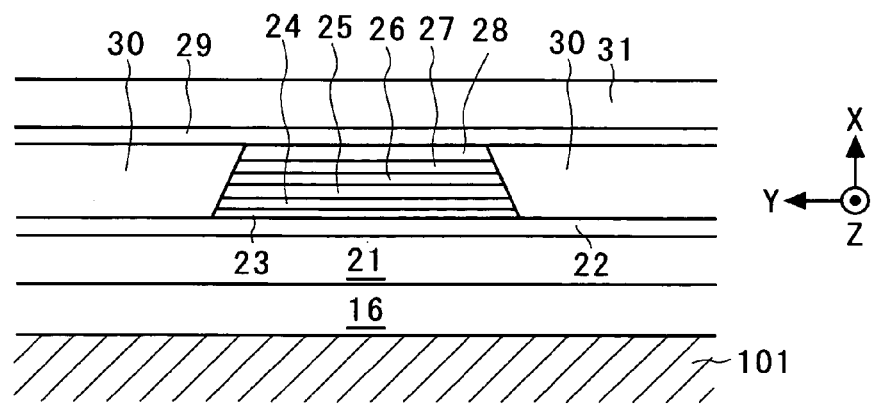

Subsequently, the upper metal layer 29 is formed by a sputtering method or the like, and the upper electrode 31 is formed by a plating method or the like (FIGS. 9A and 9B).

Finally, the gap layer 38, coil layer 37, insulating layer 39, upper magnetic layer 36, and protection layer 40 are formed, and the electrodes 5a-5d and the like are formed. By now, the wafer process is completed.

Next, magnetic heads are completed through a known process for the wafer which has undergone the wafer process. Briefly describing, each bar (bar-shaped magnetic head aggregate) having a plurality of magnetic heads arranged in a line on the base is sawed from the wafer. Next, the bar is lapped on its ABS side for setting a throat height, an MR height, and the like for the bar. Next, the protection film 4 is formed on the surface of the ABS side, and the rails 11, 12 are formed by etching or the like. Finally, the bar is cut by machining into individual magnetic heads. In this manner, the magnetic heads are completed in accordance with the first embodiment.

As described above, according to the first embodiment, the soft magnetic layers 42, 43 are formed on the hard magnetic films 32, 33, respectively, on both sides of the magneto-resistive layer in the track width direction (see FIGS. 3 and 5). Thus, the soft magnetic layers 42, 43 act as shielding layers for reducing side-reading, so that the resulting reduction in side-reading permits a narrower track width for a higher recording density.

While the first embodiment has shown an exemplary TMR head, a CPP-GMR head may be provided by forming a non-magnetic layer made of Cu, Au, Ag or the like instead of the tunnel barrier layer 26 in the first embodiment.

Next, a magnetic head according to a second embodiment of the present invention will be described with reference to FIGS. 10 to 14.

Figure 10:
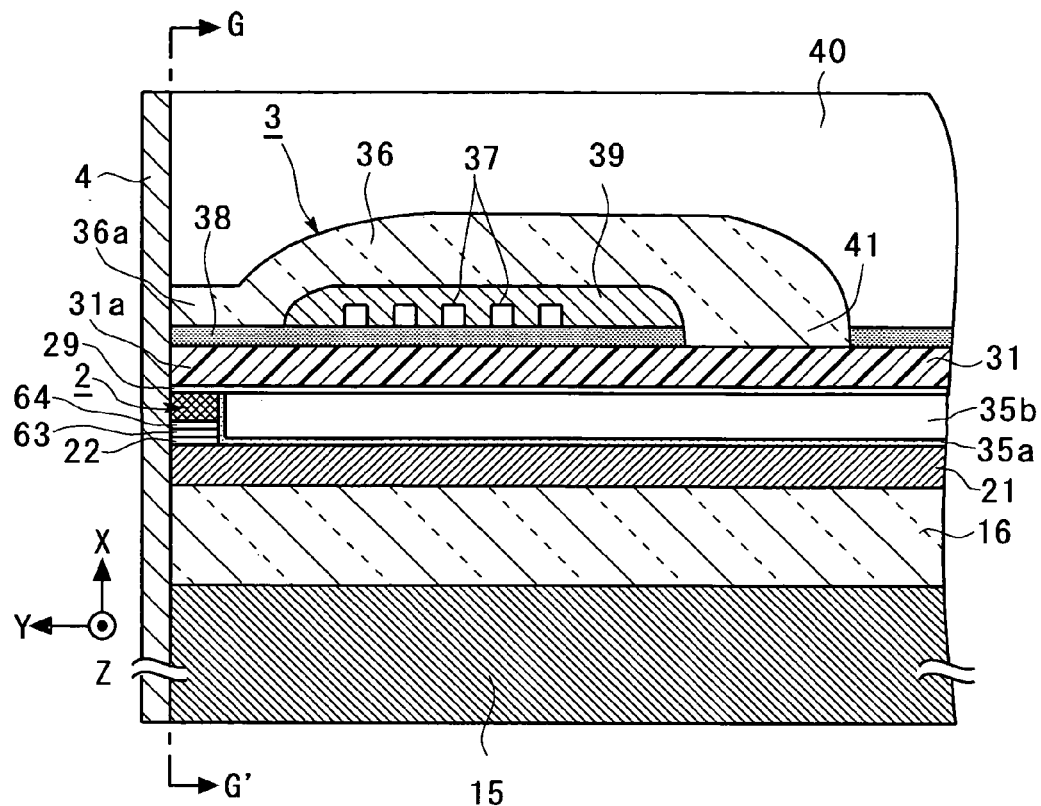
FIG. 10 is an enlarged cross-sectional view schematically illustrating a portion of a TMR device and an inductive magnetic transducing device in a magnetic head according to a second embodiment of the present invention.
Figure 11:
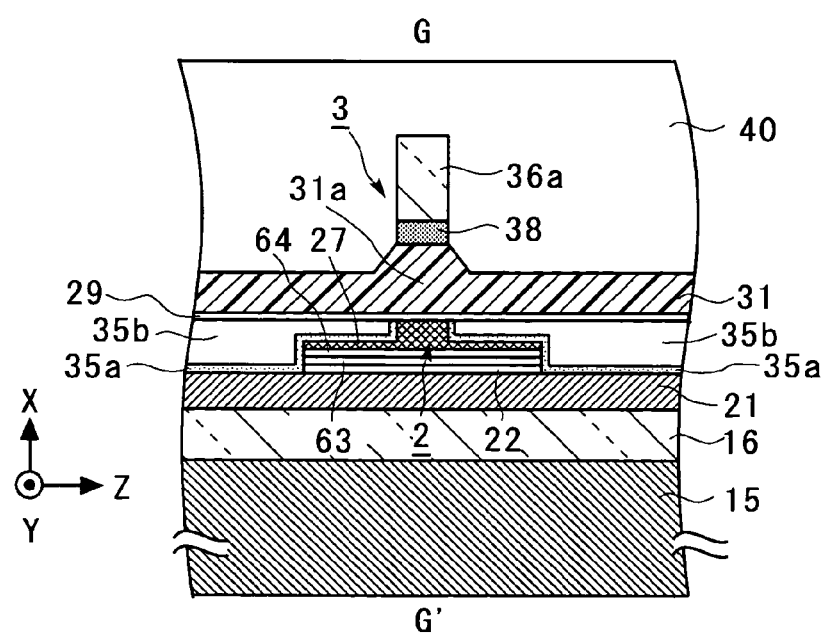
FIG. 11 is a general sectional view taken along a line G-G' indicated by arrows in FIG. 10.
Figure 12:
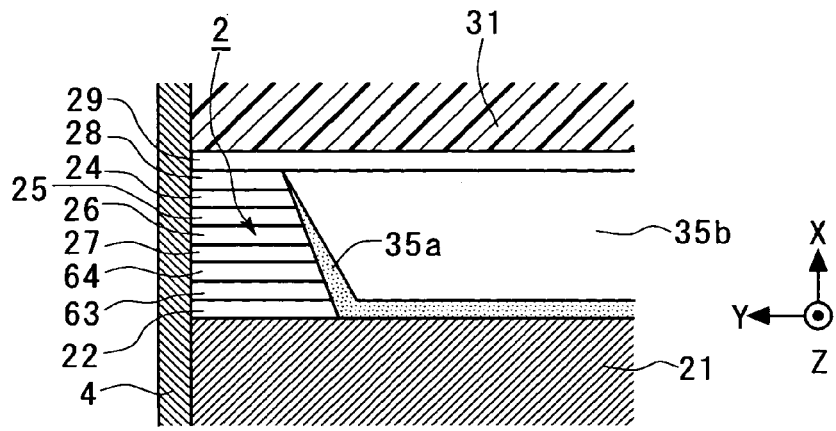
FIG. 12 is a further enlarged view around the TMR device in FIG. 10.
Figure 13:
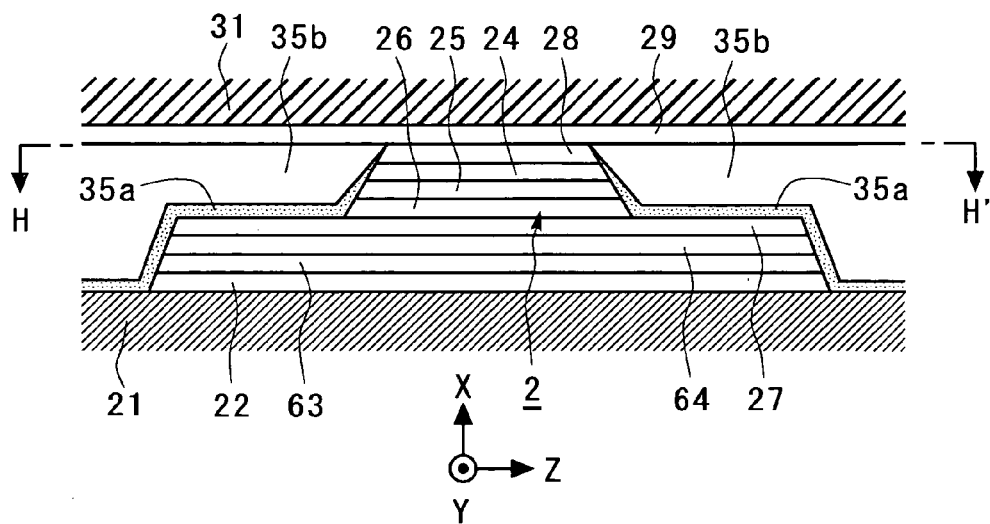
FIG. 13 is a further enlarged view around the TMR device in FIG. 11.
Figure 14:
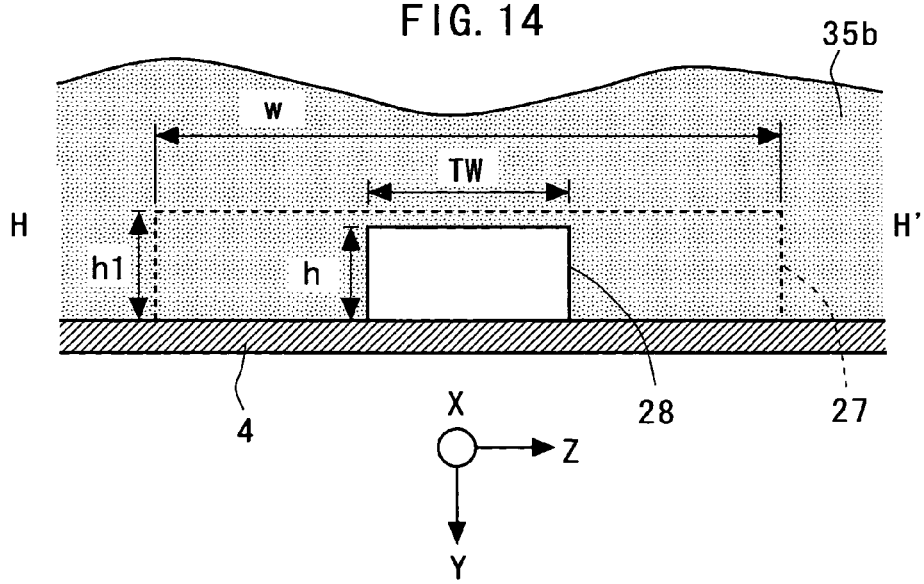
FIG. 14 is a general sectional view taken along a line H-H' indicated by arrows in FIG. 13.

FIG. 10 is an enlarged cross-sectional view schematically illustrating a portion of a TMR device 2 and an inductive magnetic transducing device 3 in a magnetic head according to a second embodiment of the present invention. FIG. 11 is a general sectional view taken along a line G-G' indicated by arrows in FIG. 10. FIG. 12 is a further enlarged view illustrating around the TMR device 2 in FIG. 10. FIG. 13 is a further enlarged view illustrating around the TMR device 2 in FIG. 11. FIG. 14 is a cross-sectional view taken along a line H-H' in FIG. 13. FIGS. 10 to 13 correspond to FIGS. 2 to 5, respectively.

In FIGS. 10 to 14, components identical or corresponding to those in FIGS. 1 to 5 are designated by the same reference numerals, and repeated description thereon is omitted. The magnetic head according to the second embodiment differs from the magnetic head according to the first embodiment only in the aspects described below.

In the second embodiment, the lower metal layers 22, 23 are replaced by a lower metal layer 22 which is a laminate of these two layers. The lower metal layer 22 is formed only in a region substantially exactly overlapping with a free layer 27, an antiferromagnetic layer 63, and a non-magnetic metal layer 64.

In the second embodiment, as illustrated in FIGS. 12 and 13, a TMR device 2 comprises a lower electrode 21 formed on the underlying layer 16; an upper electrode 31 formed overlying the lower electrode 21 (opposite to a base 15); and the lower metal layer 22, the antiferromagnetic layer 63, the non-magnetic metal layer 64, a free layer 27, a tunnel barrier layer 26, a pinned layer 25, a pin layer 24, an upper metal layer (cap layer) 28 as a non-magnetic metal layer which serves as a protection layer, and an upper metal layer 29 as an underlying layer of the upper electrode 31, which are laminated in this order from the lower electrode 21 between the electrodes 21, 31. The free layer 27, tunnel barrier layer 26, pinned layer 25 and pin layer 24 constitute a magneto-resistive layer. While the actual TMR device 2 typically has a laminate structure composed of a larger number of layers, rather than the laminate structure composed of the number of layers as illustrated, the illustrated magnetic head represents a laminate structure minimally required for the basic operation of the TMR device 2 for simplifying the description.

The antiferromagnetic layer 63 applies an exchange bias magnetic field as a biasing magnetic field to the free layer 27 in the Z-axis direction (track width direction), without fixing the magnetization direction of the free layer 27, through exchange bias with the free layer 27 by way of the non-magnetic metal layer 64. In other words, the antiferromagnetic layer 63 and non-magnetic metal layer 64 serve as a magnetic domain control layer for applying the biasing magnetic field to the free layer 27. The antiferromagnetic layer 63 is formed, for example, of an Mn-based alloy such as PtMn, IrMn, RuRhMn, FeMn, NiMn, PdPtMn, RhMn, CrMnPt, or the like. The non-magnetic metal layer 64 is formed, for example, of Cu, Ru, Rh, Cr, Au, Ag or the like. Since the non-magnetic metal layer 64 having a larger thickness results in weaker exchange bias, the thickness of the non-magnetic metal layer 64 is set so that a sufficient biasing magnetic field is applied to the free layer 27. In some cases, the non-magnetic metal layer 64 may be omitted. The pinned layer 25 has its magnetization direction fixed in the Y-axis direction by an exchange bias magnetic field between the pinned layer 25 and the pin layer 24. On the other hand, the free layer 27 freely varies its magnetization direction in response to an external magnetic field which is basically magnetic information although the biasing magnetic field is applied to the free layer 27 as described above.

As illustrated in FIGS. 12 to 14, the dimensions of the tunnel barrier layer 26, pinned layer 25, pin layer 24 and upper metal layer 28 on plan view, when seen from the X-axis direction, are defined by a desired track width TW and MR height h in the second embodiment. Strictly speaking, the dimensions of the layers 24-26, 28 on plan view are determined by simultaneously ion milling them, as described later. Therefore, these layers have tapered +Z-side, −Z-side and −Y-side end faces as illustrated in FIGS. 12 and 13, and thereby lower ones of the layers 24-26, 28 are slightly larger. However, their dimensions on plan view can be said to be substantially the same. FIG. 14 only illustrates the upper metal layer 28 of the layers 24-26, 28, which has a size of TW×h on plan view. The +Y-side (ABS side) end faces of the layers 24-26, 28 are determined by lapping, later described, and are perpendicular to the film surface.

On the other hand, in the second embodiment, the antiferromagnetic layer 63, non-magnetic metal layer 64 and free layer 27 are formed in an area having a size of w×h1, as illustrated in FIG. 14, and are formed in a region substantially exactly overlapping with the region in which the tunnel barrier layer 26, pinned layer 25, pin layer 24 and upper metal layer 28 are formed (the region having a size of TW×h) and in a region which continuously extends from that region in the +Z-side and −Z-side. Therefore, w>TW stands. Strictly speaking, the dimensions of the layers 63, 64, 27 are determined by simultaneously milling them, as described below. Therefore, these layers have tapered +Z-side, −Z-side and −Y-side end faces as illustrated in FIGS. 12 and 13, and thereby lower ones of the layers 63, 64, 27 are slightly larger. However, their dimensions on plan view can be said to be substantially the same. FIG. 14 only illustrates the free layer 27 of the layers 63, 64, 27, which has a size of w×h1 on plan view. Also, the −Y-side end faces of the layers 24-28, 64, 63 are continuously tapered because these layers are simultaneously ion milled, so that the width h1 is wider than the width h, when strictly speaking. However, the widths h1, h can be said to be substantially the same. But, h1>h is assumed in FIG. 14 for facilitating the understanding. Alternatively, the layers 63, 64, 27 may be formed in a region substantially exactly overlapping with the layers 24-26, 28.

As described above, since the antiferromagnetic layer 63 and non-magnetic metal layer 63 constitute the magnetic domain control layers, the magnetic head according to the second embodiment eliminates the hard magnetic layers 32, 33 and insulating layer 34 which are formed in the first embodiment. Also, the soft magnetic layers 42, 43 are removed. In addition, in the second embodiment, instead of the layers 32-34, 42, 43 formed in the first embodiment, a lower insulating layer 35*a*, and an overlying soft magnetic layer 35*b* are formed not only on the −Y-side (opposite to ABS) of the layers 22, 63, 64, 27, 26, 25, 24, 28 but also on the +Z-side and −Z-side of these layers. The soft magnetic layer 35*b* does not form part of the layer for applying a biasing magnetic field to the free layer 27. In accordance with the prior art, an insulating layer made of $Al_2O_3$ or $SiO_2$ may be formed instead of the insulating layer 35*a* and soft magnetic layer 35*b* in a portion in which the layers 35*a*, 35*b* are formed in the second embodiment. In the second embodiment, the insulating layer 35*a* and soft magnetic layer 35*b* constitute a film which is formed to be in contact with an effective region effectively involved in detection of magnetism in the magneto-resistive layer (in the second embodiment, a region in which a current flows in a direction substantially perpendicular to the film surface in the magneto-resistive layer) on both sides of the effective region in the track width direction (Z-axis direction) and on the side of the effective region opposite to the ABS without overlapping with the effective region. The insulating layer 35*a* is preferably formed in a smallest possible thickness, while ensuring the insulating property of the soft magnetic layer 35*b*, for reducing more side-reading.

Next, description will be made on an exemplary method of manufacturing the magnetic head according to the second embodiment.

First, a wafer process is performed. Specifically, a wafer 101 made of $Al_2O_3$—TiC, SiC or the like is provided for making the base 15. Using the thin film forming technology and the like, the aforementioned layers are formed in a large number of magnetic head forming regions in matrix on the wafer 101 to provide the aforementioned structure.

Figure 15A:
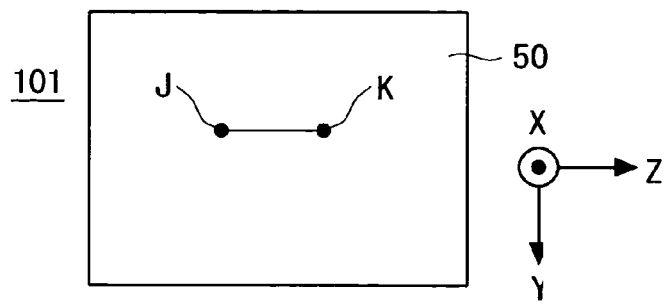
FIGS. 15A and 15B are diagrams schematically illustrating a step which makes up a wafer process in a method of manufacturing the magnetic head illustrated in FIGS. 10 to 14.
Figure 15B:
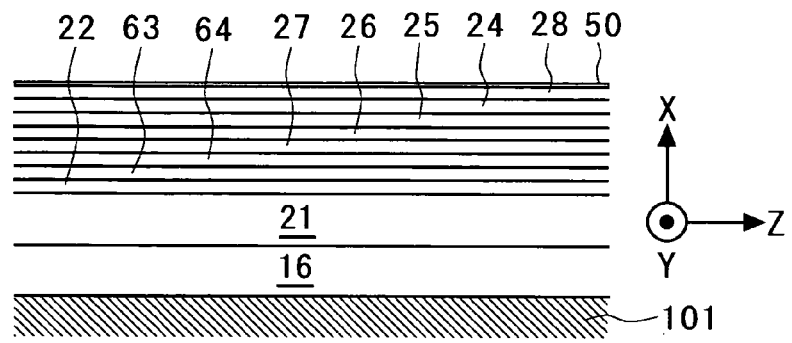
Figure 16A:
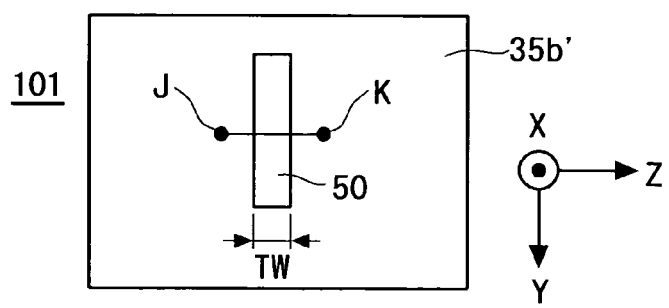
FIGS. 16A and 16B are diagrams schematically illustrating a further step which makes up the wafer process in the method of manufacturing the magnetic head illustrated in FIGS. 10 to 14.
Figure 16B:
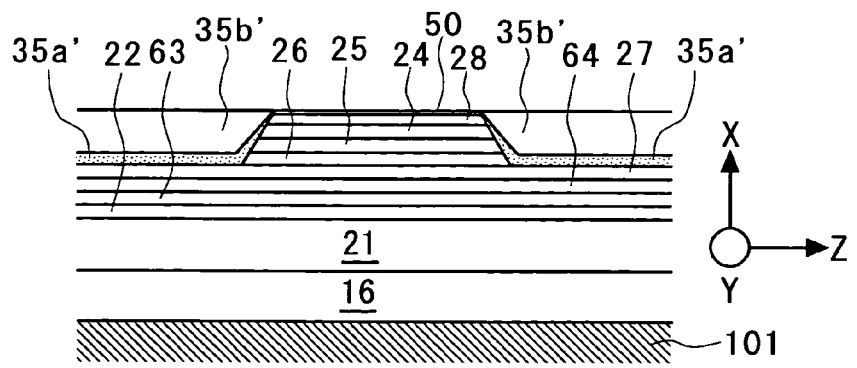
Figure 17A:
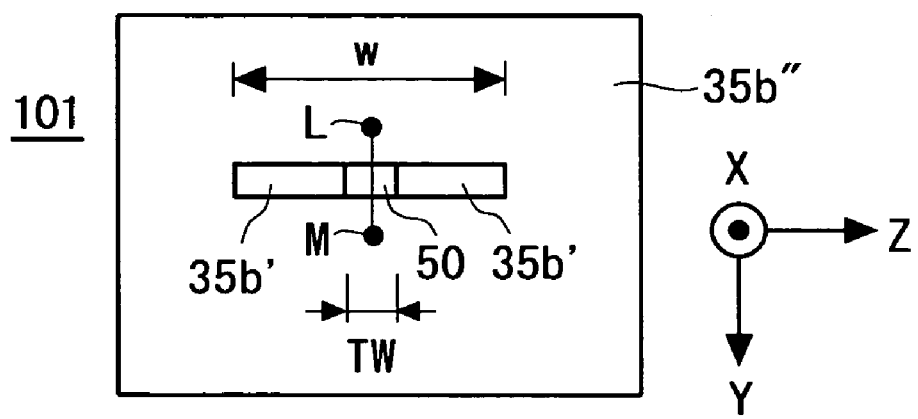
FIGS. 17A and 17B are diagrams schematically illustrating a further step which makes up the wafer process in the method of manufacturing the magnetic head illustrated in FIGS. 10 to 14.
Figure 17B:
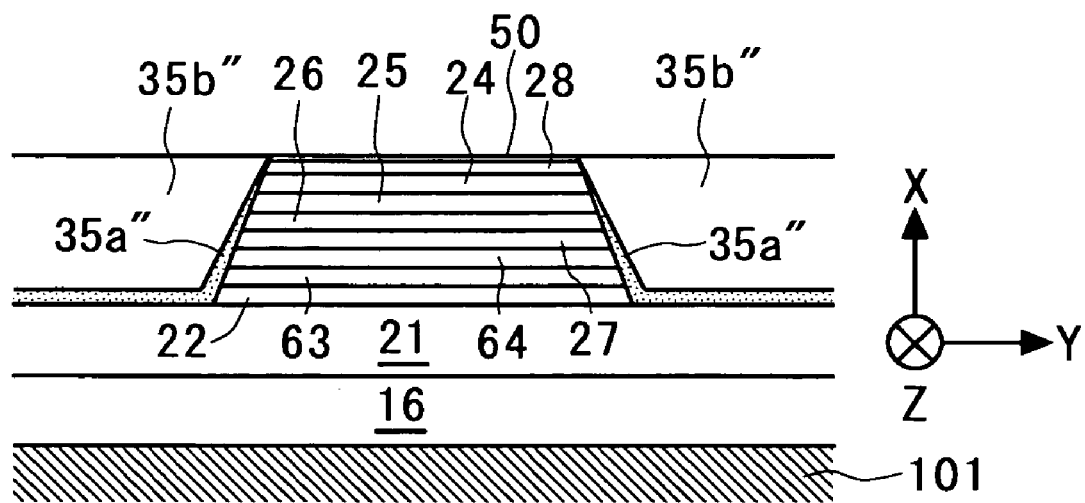
Figure 19A:
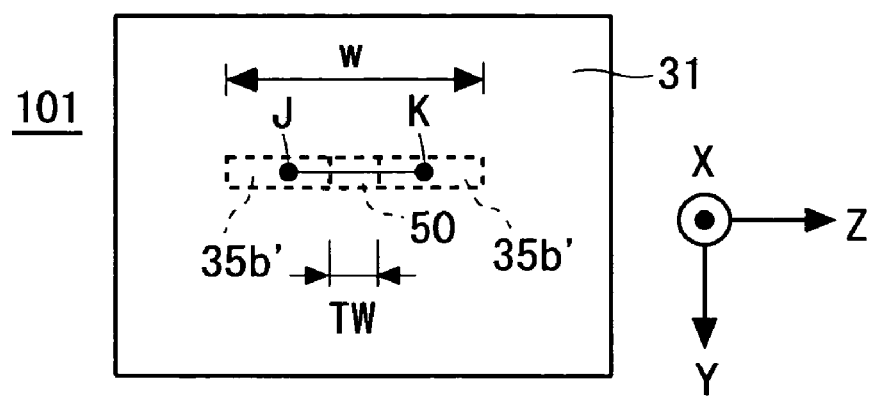
FIGS. 19A and 19B are diagrams schematically illustrating a further step which makes up the wafer process in the method of manufacturing the magnetic head illustrated in FIGS. 10 to 14.
Figure 19B:
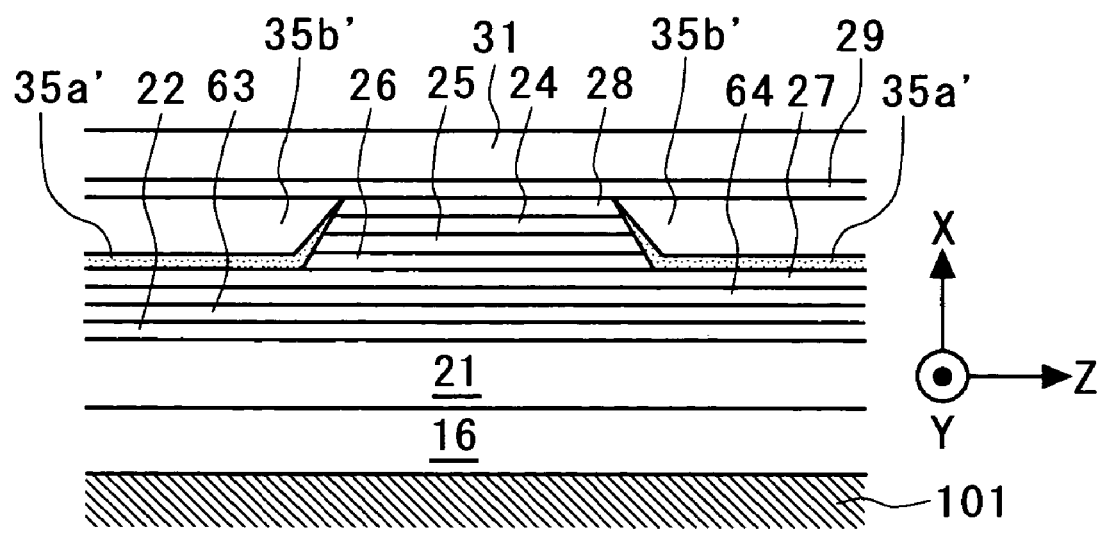

The outline of the wafer process will be described with reference to FIGS. 15. to 19. FIGS. 15 to 19 are diagrams schematically illustrating respective steps which make up the wafer process, wherein FIGS. 15A, 16A, 17A and 19A are general plan views, respectively; FIG. 15B is a general cross-sectional view taken along a line J-K in FIG. 15A; FIG. 16B is a general cross-sectional view taken along a line J-K in FIG. 16A; FIG. 17B is a general cross-sectional view taken along a line L-M in FIG. 17A; and FIG. 19B is a general cross-sectional view taken along a line J-K in FIG. 19A. FIG. 18 is a general cross-sectional view corresponding to FIG. 17B. In FIGS. 16A, 17A and 19A, TW indicates the width of a track defined by the TMR device 2, and w indicates the width of the antiferromagnetic layer 63, non-magnetic metal layer 64 and free layer 27 in the Z-axis direction (track width direction). These widths correspond to those designated by the same reference letters in FIG. 14, respectively.

First, in the wafer process, the underlying layer 16, lower electrode 21, lower metal layer 22, antiferromagnetic layer 63, non-magnetic metal layer 64, free layer 27, tunnel barrier layer 26, pinned layer 25, pin layer 24, and upper metal layer 28 are sequentially laminated on the wafer 101 (FIGS. 15A and 15B). In this event, the lower electrode 21 is formed, for example, by a plating method, while the other layers are formed, for example, by a sputtering method. The upper metal layer 28 is formed in a predetermined thickness such that the thickness of the upper metal layer 28 remains 7 nm or more after dry etching for removing the surface oxide film described later. Subsequently, the substrate in this state is once left in the atmosphere. In this event, the top face of the magneto-resistive layer (top surface of the pin layer 24 in the second embodiment) is protected by the upper metal layer 28, so that it is not oxidized. However, the oxide film 50 is formed on the top face of the upper metal layer 28 (FIGS. 15A and 15B).

Next, tunnel barrier layer 26, pinned layer 25, pin layer 24, upper metal layer 28 and oxide film 50 are partially removed by first ion milling, except for a strip portion extending in the Z-axis direction by a length in accordance with the track width TW. In this event, the first ion milling is stopped at a position at which the free layer 27 is hardly removed while layers up to the tunnel barrier layer 26 are completely removed. Such a stop position can be appropriately set by monitoring materials produced during the milling, for example, by SIMS (Secondary ion-microprobe Mass Spectrometer). In some cases, the first ion milling may be stopped at an arbitrary position at which the free layer has been fully removed. Then, after the first milling, an insulating layer 35a' which is to be a portion of the insulating layer 35a, and a soft magnetic layer 35b' which is to be a portion of the soft magnetic layer 35b are formed using a lift-off method in a portion removed by the first ion milling (FIGS. 16A and 16B).

Next, the lower metal layer 22, antiferromagnetic layer 63, non-magnetic metal layer 64, free layer 27, tunnel barrier layer 26, pinned layer 25, pin layer 24, upper metal layer 28, insulating layer 35a' and soft magnetic layer 35b' are partially removed while leaving a strip portion which has a necessary width (width in the Y-axis direction) with respect to the height direction of the TMR device 2, and extends in the Z-axis direction by a distance in conformity to the width w. In the second embodiment, the second ion milling is stopped at a position at which the lower electrode 21 is hardly removed while layers up to the lower metal layer 22 is completely removed. Alternatively, the second ion milling may be stopped, for example, at a position at which the lower metal layer 22 is hardly removed while layers up to the antiferromagnetic layer 63 are completely removed. Then, an insulating layer 35a" which is to be the remaining portion of the insulating layer 35a, and a soft magnetic layer 35b" which is to be the remaining portion of the soft magnetic layer 35b are formed in a portion removed by the second ion milling, using a lift-off method (FIGS. 17A and 17B).

Next, the oxide film 50 formed on the top face of the upper metal layer 28 is removed by dry etching such as sputter etching, ion beam etching or the like in the same vacuum chamber in which the upper metal layer 29 is formed. In this event, since the upper metal layer 28 is formed in a relatively large thickness of 7 nm or more, the upper metal layer 28 reduces a damage to the tunnel barrier layer 26 by an ion beam which is passing along the path 1 in FIG. 18. On the other hand, the soft magnetic layer 35b (35b', 35b") intervening in the path 2 in FIG. 18 reduces a damage to the tunnel barrier layer 26 by an ion beam which do not pass the upper metal layer 28 but are directing to the −Y-side, +Z-side, and −Z-side end faces of the tunnel barrier layer 26 through the path 2 in FIG. 18. While in FIG. 18, the ion beam is shown to travel only in the X-axis direction, the ion beam actually have a component which is obliquely incident with respect to the X-axis direction as well.

Subsequently, the upper metal layer 29 is formed by a sputtering method or the like, and the upper electrode 31 is formed by a plating method or the like (FIGS. 19A and 19B).

Finally, the gap layer 38, coil layer 37, insulating layer 39, upper magnetic layer 36, and protection layer 40 are formed, and the electrodes 5a-5d and the like are formed. By now, the wafer process is completed.

Next, magnetic heads are completed through a known process for the wafer which has undergone the wafer process. Briefly describing, each bar (bar-shaped magnetic head aggregate) having a plurality of magnetic heads arranged in a line on the base is sawed from the wafer. Next, the bar is lapped on its ABS side for setting a throat height, an MR height, and the like for the bar. Then, the ABS surface of the lapped bar is etched as required for removing smear. Next, the protection film 4 is formed on the surface of the ABS side, and the rails 11, 12 are formed by etching or the like. Finally, the bar is cut by machining into individual magnetic heads. In this manner, the magnetic heads are completed in accordance with the second embodiment.

As described above, according to the second embodiment, the soft magnetic layers 35b are formed on both sides of the magneto-resistive layer in the track width direction, respectively (see FIGS. 11 and 13). Thus, the soft magnetic layers 35b act as shielding layers for reducing side-reading, so that the resulting reduction in side-reading permits a narrower track width for a higher recording density.

Also, according to the second embodiment as described above, since the upper metal layer 28 is formed on the top surface of the pin layer 24, the upper metal layer 28 prevents the surface of the pin layer 24 from oxidization. In addition, even if the surface of the upper metal layer 28 is oxidized in the air, the surface oxide film 50 on the upper metal layer 28 is removed by dry etching before the upper metal layer 29 is formed, so that a good electric contact can be established between the upper electrode 31 and upper metal layer 28. In this event, the magneto-resistive layer is damaged by an ion beam in the dry etching. However, in the second embodiment, since the upper metal layer 28 has the thickness of 7 nm or more which is relatively thick, the magneto-resistive layer (particularly, the tunnel barrier layer 26) is less damaged by the ion beam along the path 1 in FIG. 18. In addition, in the second embodiment, since the soft magnetic layers 35b", 35b' are interposed in the path 2 in FIG. 18 (see, however, FIG. 17A for the soft magnetic layer 35b'), the tunnel barrier layer 26 is less damaged by the ion beam directing to the −Y-side, +Z-side and −Z-side end faces of the tunnel barrier layer 26 along the path 2, as compared with the prior art device which includes only $Al_2O_3$ or $SiO_2$ in the path 2 (a comparative example corresponding to this will be described later).

Now, the magnetic head according to the second embodiment described above is modified in the following manner in accordance with the prior art, and the resulting magnetic head is regarded as a comparative example. This magnetic head according to the comparative example has an insulating layer 35 made of $Al_2O_3$ or $SiO_2$ which is formed instead in the region in which the insulating layer 35a and soft magnetic layer 35b are formed in the aforementioned magnetic head according to the second embodiment. The magnetic head according to the comparative example can be basically manufactured in a method similar to the method of manufacturing the magnetic head according to the second embodiment. FIG. 20 is a general cross-sectional view schematically illustrating a step in a method of manufacturing the magnetic head according to the comparative example, which corresponds to the ion milling shown in FIG. 18. As illustrated in FIG. 20, since the insulating layer 35 made of $Al_2O_3$ or $SiO_2$ alone is interposed in the path 2 in the comparative example, the tunnel barrier layer 26 is more damaged by the ion beam which is traveling to the −Y-side, +Z-side and −Z-side end faces of the tunnel barrier layer 26 along the path 2 without passing through the metal layer 28 (note however that the state on the +Z-side and −Z-side end faces does not appear in FIG. 20), as compared with the state illustrated in FIG. 18.

In the magnetic head corresponding to the conventional magnetic head which has the magnetic domain control layer laminated on the magneto-resistive layer like the magnetic head according to the second embodiment, the insulating layer 35 made of $Al_2O_3$ or $SiO_2$ is formed entirely near the −Y-side, +Z-side, and −Z-side end faces of the tunnel barrier layer 26, unlike the magnetic head employing the abutted structure. As appreciated from the foregoing, the magnetic head according to the second embodiment provides significant advantages.

As described above, the magnetic head according to the second embodiment can simultaneously provide both advantages of: (a) reducing the side-reading to narrow the track width for increasing a recording density; and (b) removing a surface oxide film on a non-magnetic metal layer to reduce the resistance while limiting a damage caused by an ion beam to eventually improve the characteristic of the device. In addition, since the soft magnetic layers 35 contributes to simultaneously providing both advantages, the magnetic head can be simple in structure and easy to manufacture, as compared with a magnetic head which is formed with a special layer for reducing the ion beam damage.

While the second embodiment has shown an exemplary TMR head, a CPP-GMR head may be provided by forming a non-magnetic layer made of Cu, Au, Ag or the like instead of the tunnel barrier layer 26 in the second embodiment.

Also, as illustrated in the second embodiment, the insulating layer 35a and soft magnetic layer 35b are preferably formed on the −Y-side of the layers 63, 64, 24-28 (opposite to the ABS side) in order to reduce damages to the tunnel barrier layer 26. However, in the present invention, an insulating layer alone or a plurality of layers comprised of a lowermost insulating layer and an overlying layer made of a material other than a soft magnetic material may be formed instead of the insulating layer 35a and soft magnetic layer 35b in a region in which these layers are formed on the −Y-side of the layers 63, 64, 24-28.

Further, as described above, the layers 63, 64, 27 may be formed in a region which substantially exactly overlaps with the layers 24-26, 28. In this case, for example, these layers may be collectively milled simultaneously, followed by simultaneous and collective formation of the insulating layer 35a and soft magnetic layer 35b on the +Y-side, −Y-side, +Z-side, and −Z-side of these layers by the lift-off method. Consequently, this further facilitates the manufacturing of the magnetic head.

Next, a magnetic head according to a third embodiment of the present invention will be described with reference to FIGS. 21 and 22.

Figure 21:
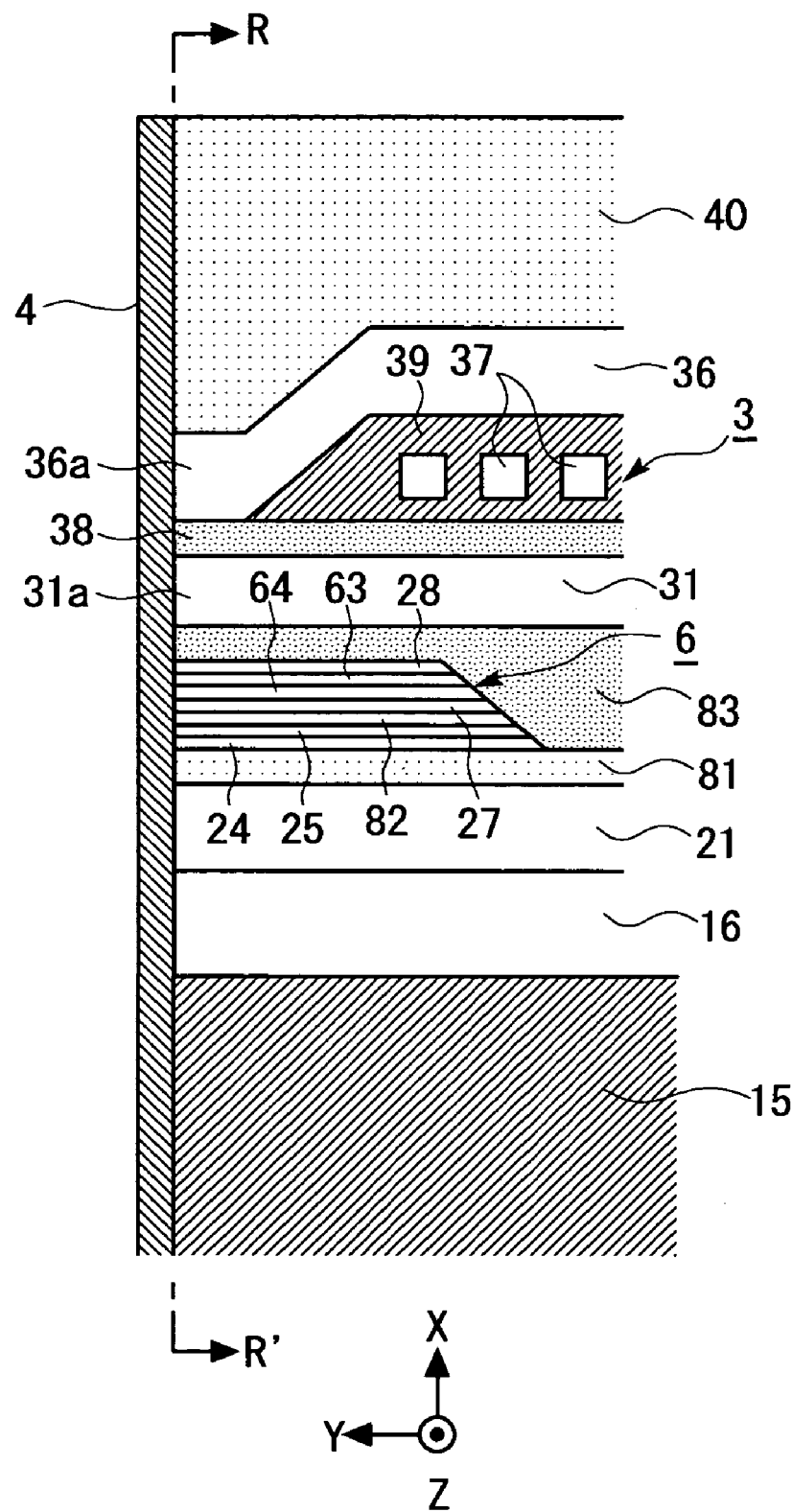
FIG. 21 is an enlarged cross-sectional view schematically illustrating a portion of a GMR device and an inductive magnetic transducing device in a magnetic head according to a third embodiment of the present invention.

FIG. 21 is an enlarged cross-sectional view schematically illustrating a portion of a GMR device 6 and an inductive magnetic transducing device 3 in a magnetic head according to a third embodiment of the present invention. FIG. 22 is a general sectional view taken along a line R-R' indicated by arrows in FIG. 21. FIGS. 21 and 22 correspond to FIGS. 3 and 4, respectively. FIGS. 21 and 22 also correspond to FIGS. 12 and 13, respectively. In FIGS. 21 and 22, components identical or corresponding to those in FIGS. 1 to 5 and FIGS. 10 to 13 are designated by the same reference numerals, and repeated description thereon is omitted. The magnetic head according to the third embodiment mainly differs from the magnetic head according to the second embodiment in the aspects described below.

The magnetic head according to the third embodiment comprises a GMR device 6 which is provided as a magneto-resistive device instead of the TMR device 2, and removes the insulating layers 23, 29, which have been provided in the second embodiment, so that a sense current flows through soft magnetic layers 84a, 84b, which also function as lead layers, later described, in parallel with a film surface of the GMR device 6 (i.e., in the Z-axis direction). In other words, the magnetic head according to the third embodiment is created as a CIP-GMR head.

Figure 22:
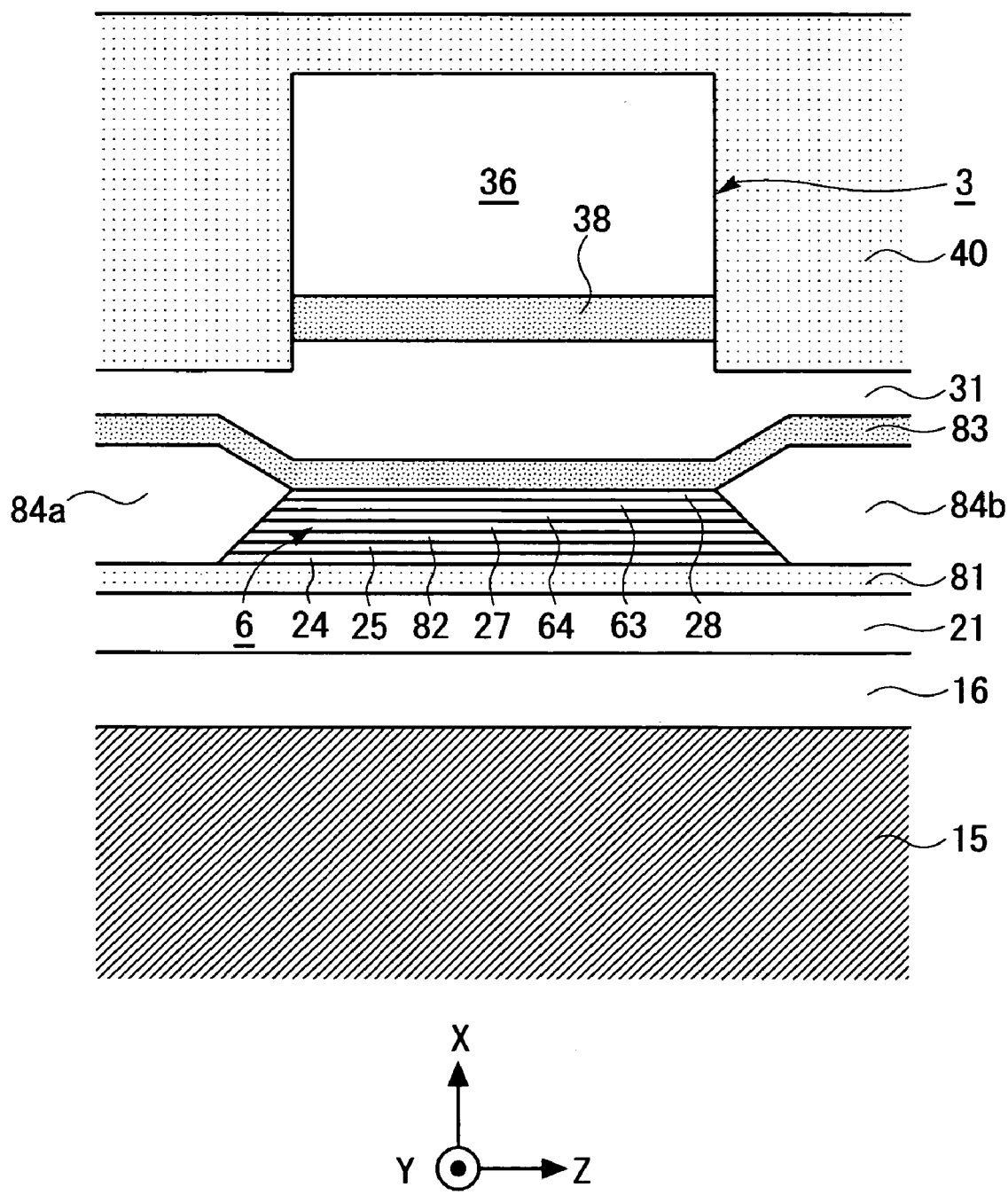
FIG. 22 is a general sectional view taken along a line R-R' indicated by arrows in FIG. 21.

As illustrated in FIGS. 21 and 22, the GMR device 6 in the third embodiment comprises a pin layer 24, a pinned layer 25, a non-magnetic layer 82, a free layer 27, a non-magnetic metal layer 64, a anti-ferromagnetic layer 63, and an upper metal layer (cap layer) 28 as a non-magnetic metal layer which serves as a protection layer, which are laminated in this order from a base 15. The pinned layer 25, non-magnetic layer 82, and free layer 27 constitute a spin valve film as a magneto-resistive layer. A material suitable for the non-magnetic layer 82 may be, for example, Cu, Au, Ag, or the like. Like the aforementioned second embodiment, the anti-ferromagnetic layer 63 and non-magnetic metal layer 64 function as a magnetic domain control layer for applying a biasing magnetic field to the free layer 27.

As illustrated in FIGS. 21 and 22, the GMR device 6 is sandwiched between a lower magnetic shield layer 21 and an upper magnetic shield layer 31 laminated on an underlying layer 16 through a lower insulating layer 81 and an upper insulating layer 83. In the third embodiment, the magnetic shield layers 21, 31 do not additionally function as electrodes. In the third embodiment, since the anti-ferromagnetic layer 63 and non-magnetic metal layer 64 constitute the magnetic domain control layer, the hard magnetic layers 32, 33 are not provided, unlike the first embodiment. The layers 24, 25, 82, 27, 64, 63, 28 are formed in a region in which they substantially exactly overlap one another, and the soft magnetic layers 84a, 84b are formed on both sides of these layers in the Z-axis direction (track width direction). The soft magnetic layers 84a, 84b are also sandwiched between the insulating layers 81, 83. The soft magnetic layers 84a, 84b do not form part of a layer for applying a biasing magnetic field to the free layer 27. In the third embodiment, the soft magnetic layers 84a, 84b additionally function as lead layers for leading a sense current.

As will be appreciated from the foregoing description, in the third embodiment, the soft magnetic layers 84a, 84b on both sides of the magneto-resistive layer in the Z-axis direction constitute a film which is formed to be in contact with an effective region effectively involved in the detection of magnetism in the magneto-resistive layer (in the third embodiment, a region in which a current flows in a direction substantially parallel to the film surface in the magneto-resistive layer) on both sides of the effective region in the track width direction (Z-axis direction) without overlapping with the effective region. As illustrated in FIG. 21, an insulating layer 83 is positioned on the side (−Y-side) of the magneto-resistive layer opposite to the ABS.

Next, description will be made on an exemplary method of manufacturing the magnetic head according to the third embodiment.

First, a wafer process is performed. Specifically, a wafer 101 made of $Al_2O_3$—TiC, SiC or the like is provided for making the base 15. Using the thin film forming technology and the like, the aforementioned layers are formed in a large number of magnetic head forming regions in matrix on the wafer 101 to provide the aforementioned structure.

Figure 23A:
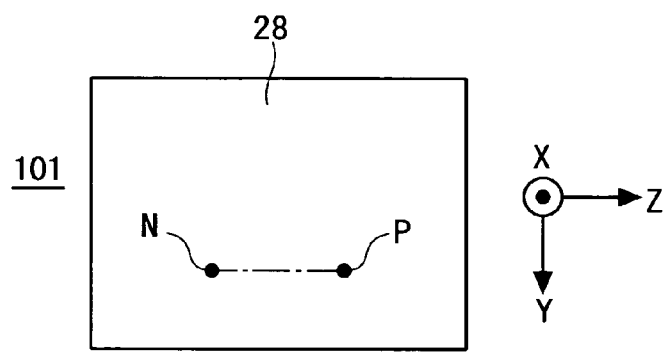
FIGS. 23A and 23B are diagrams schematically illustrating a step which makes up a wafer process in a method of manufacturing the magnetic head illustrated in FIGS. 21 and 22.
Figure 23B:
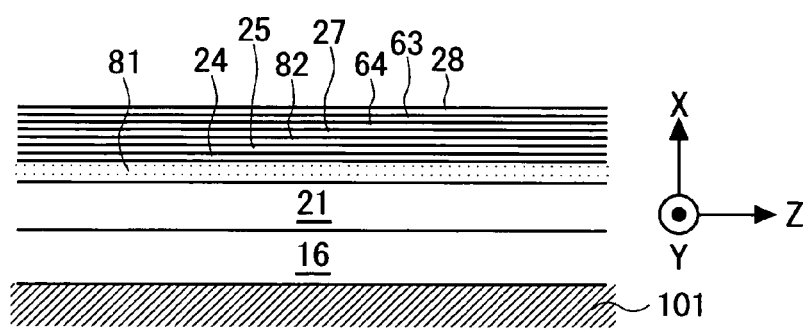
Figure 24A:
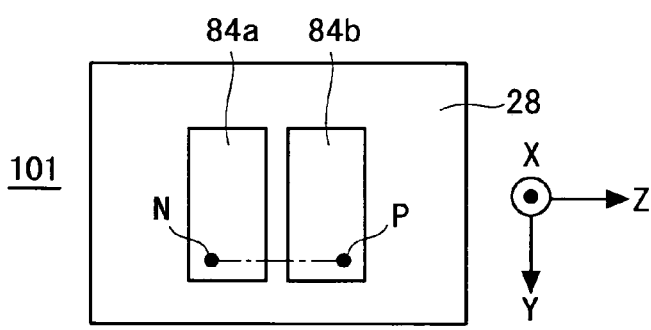
FIGS. 24A and 24B are diagrams schematically illustrating a further step which makes up the wafer process in the method of manufacturing the magnetic head illustrated in FIGS. 21 and 22.
Figure 24B:
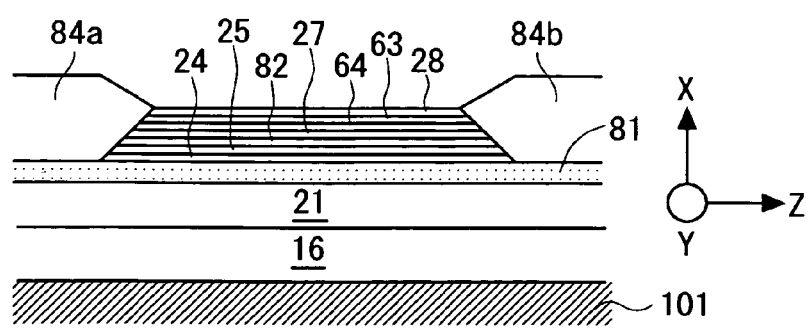
Figure 25A:
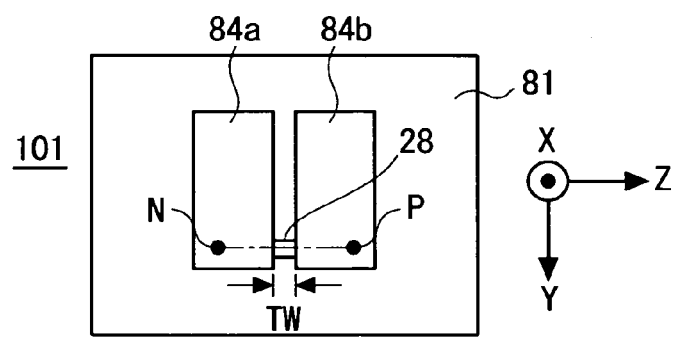
FIGS. 25A and 25B are diagrams schematically illustrating a further step which makes up the wafer process in the method of manufacturing the magnetic head illustrated in FIGS. 21 and 22.
Figure 25B:
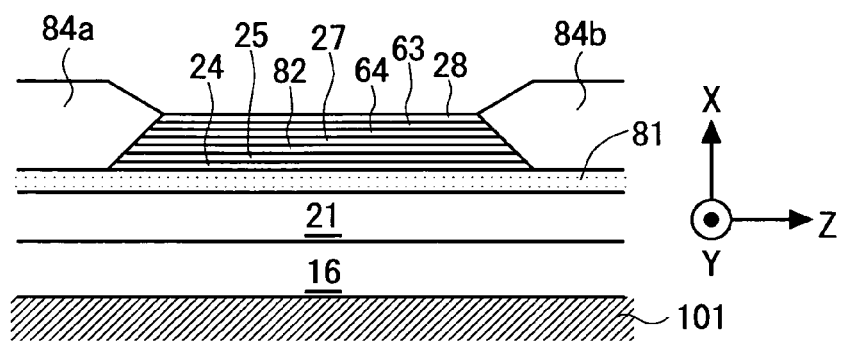
Figure 26A:
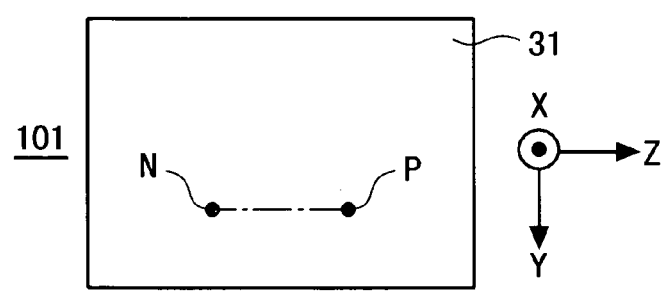
FIGS. 26A and 26B are diagrams schematically illustrating a further step which makes up the wafer process in the method of manufacturing the magnetic head illustrated in FIGS. 21 and 22.
Figure 26B:
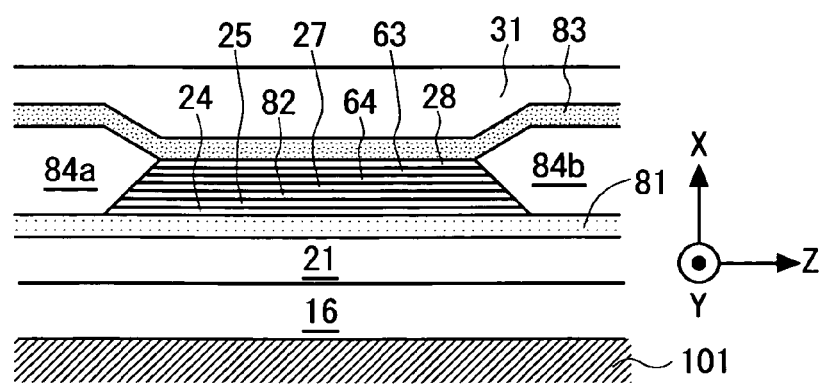

The outline of the wafer process will be described with reference to FIGS. 23 to 26. FIGS. 23 to 26 are diagrams schematically illustrating respective steps which make up the wafer process, wherein FIGS. 23A, 24A, 25A, and 26A are general plan views, respectively; FIG. 23B is a general cross-sectional view taken along a line N-P in FIG. 23A; FIG. 24B is a general cross-sectional view taken along a line N-P in FIG. 24A; FIG. 25B is a general cross-sectional view taken along a line N-P in FIG. 25A; and FIG. 26B is a general cross-sectional view taken along a line N-P in FIG. 26A. In FIG. 25A, TW indicates the width of a track defined by the GMR device 6.

First, in the wafer process, the underlying layer 16, lower magnetic shield layer 21, lower insulating layer 81, pin layer 24, pinned layer 25, non-magnetic layer 82, free layer 27, non-magnetic metal layer 64, anti-ferromagnetic layer 63, and upper metal layer 28 are sequentially laminated on the wafer 101. In this event, the lower electrode 21 is formed, for example, by a plating method, while the other layers are formed, for example, by a sputtering method (FIGS. 23A and 23B).

Next, the layers 24, 25, 82, 27, 64, 63, 28 are partially removed by first ion milling. Then, the soft magnetic layers 84a, 84b are formed in the removed portions by a lift-off method (FIGS. 24A and 24B). Subsequently, the layers 24, 25, 82, 27, 64, 63, 28 are patterned into the shape of the GMR device 6 by second ion milling (FIGS. 25A and 25B). Next, the upper insulating layer 83 and upper magnetic shield layer 31 are sequentially formed (FIGS. 26A and 26B). Finally, the gap layer 38, coil layer 37, insulating layer 39, upper magnetic layer 36, and protection layer 40 are formed, and the electrodes 5a-5d and the like are formed. By now, the wafer process is completed.

Next, magnetic heads are completed through a known process for the wafer which has undergone the wafer process. Briefly describing, each bar (bar-shaped magnetic head aggregate) having a plurality of magnetic heads arranged in a line on the base is sawed from the wafer. Next, the bar is lapped on its ABS side for setting a throat height, an MR height, and the like for the bar. Next, the protection film 4 is formed on the surface of the ABS side, and the rails 11, 12 are formed by etching or the like. Finally, the bar is cut by machining into individual magnetic heads. In this manner, the magnetic heads are completed in accordance with the third embodiment.

As described above, according to the third embodiment, the soft magnetic layers 84a, 84b are formed respectively on both sides of the magneto-resistive layer in the track width direction (see FIG. 22). Thus, the soft magnetic layers 84a, 84b act as shielding layers for reducing side-reading, so that the resulting reduction in side-reading permits a narrower track width for a higher recording density.

Also, in the third embodiment, the soft magnetic layers 84a, 84b additionally function as lead layers for leading a sense current in the CIP structure, so that even if the MR height is reduced in association with an increase in recording density, the soft magnetic layers 84a, 84b can be increased in thickness to prevent a larger lead resistance. Thus, the magnetic head according to the third embodiment can also advantageously reduce the side-reading with suffice, while preventing a reduction in head output, even if the MR height is reduced in association with an increase in the recording density. This aspect will be further discussed below.

Assume now that magnetic head according to the third embodiment is modified in the following manner in accordance with the conventional CIP structure. Specifically, in accordance with the conventional CIP structure, the soft magnetic layers 84a, 84b shown in FIG. 22 are replaced with lead layers made of a non-magnetic material (Ta, Au, Cu, Cr, any alloy of these materials, or the like).

In this case, if the lead layers made of a non-magnetic material are relatively reduced in thickness, the upper magnetic shield layer 31 moves downward from the position shown in FIG. 22 on both sides of the magneto-resistive layer in the track width direction, so that the upper magnetic shield layer 31 contributes, to some degree, to a reduction in side-reading. In this event, if the MR height is set at a relatively large value at the cost of a considerable increase in the recording density, the lead layers have a relatively large width in the MR height direction (depth direction when viewed from the ABS side), so that thinner lead layers would not result in an increased lead resistance and a resulting reduction in head output. Here, a smaller lead resistance results in a larger head output, while a larger lead resistance results in a smaller head output for the reason set forth below. Since the head resistance (=device resistance+lead resistance) is generally set at a certain value (for example, 50Ω), a smaller lead resistance means an increase in the device resistance R, while a larger lead resistance means a reduction in the device resistance R. Since the MR ratio of an MR device in the actual size does not depend on the size of the device, a larger device resistance R means an increase in resistance varying amount ΔR (=R×MR-ratio), which results in a larger head output ΔV (=ΔR×Is) when a sense current Is is constant. Conversely, a smaller device resistance R would result in a smaller head output ΔV.

However, when the soft magnetic layers 84a, 84b shown in FIG. 22 are replaced with lead layers made of a non-magnetic material, a reduction in the MR height of the lead layers causes the width of the lead layers to be narrower in the MR height direction with the trend of increasing the recording density. Therefore, if the lead layers are kept relatively thin in order to ensure a side-reading reduction effect, the lead resistance will be increased correspondingly. As a result, the head output will be reduced for the reason set forth above. If the read layers were increased in thickness to limit the read resistance with the intention of preventing the reduction in the head output, the upper magnetic shield layer 31 would move upward from the position shown in FIG. 22 on both sides of the magneto-resistive layer in the track width direction, causing the side-reading to significantly appear.

On the other hand, in the third embodiment, the soft magnetic layers 84a, 84b additionally function as lead layers for leading a sense current in the CIP structure, so that even if the MR height is reduced, the lead resistance can be reduced by increasing the soft magnetic layers 84a, 84b in thickness. Therefore, the magnetic head according to the third embodiment can prevent a reduction in the head output even if it has a smaller MR height. It should be of course understood that the thicker soft magnetic layers 84a, 84b will not at all affect a sufficient reduction in the side-reading achieved thereby.

As will be appreciated from the foregoing, the magnetic head according to the third embodiment can advantageously prevent a reduction in the head output, while sufficiently reducing the side-reading, by increasing the soft magnetic layers 84a, 84b in thickness even if the MR height is reduced as required for a higher recording density.

Next, a magnetic head according to a fourth embodiment of the present invention will be described with reference to FIG. 27.

Figure 27:
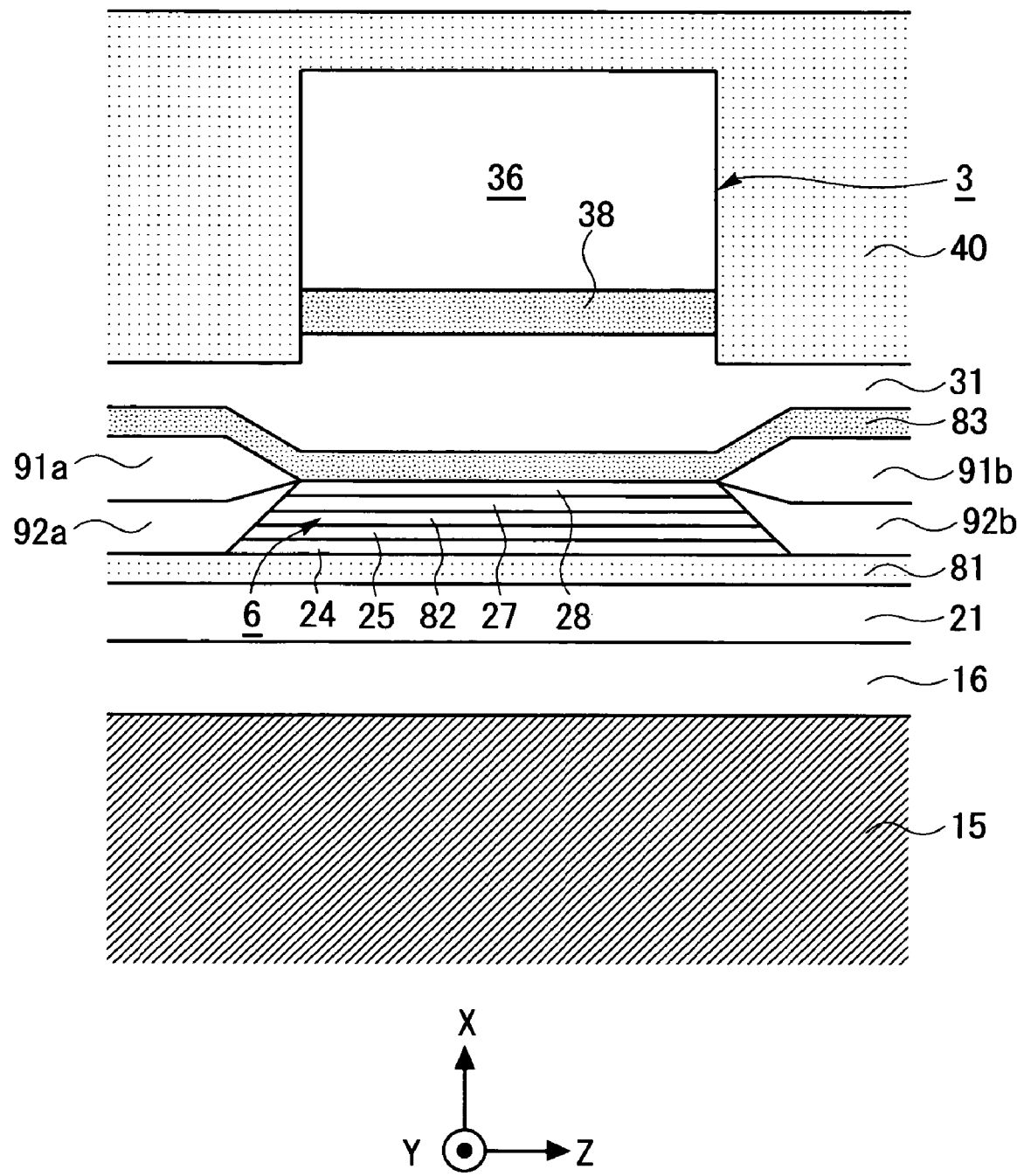
FIG. 27 is an enlarged cross-sectional view schematically illustrating a portion of a GMR device and an inductive magnetic transducing device in a magnetic head according to a fourth embodiment of the present invention.

FIG. 27 is an enlarged cross-sectional view schematically illustrating a GMR device 6 and an inductive magnetic transducing device 3 in a magnetic head according to a fourth embodiment of the present invention, and corresponds to FIG. 22.

In FIG. 27, components identical or corresponding to those in FIG. 22 are designated by the same reference numerals, and repeated description thereon is omitted. The magnetic head according to the fourth embodiment differs from the magnetic head according to the third embodiment only in the aspects described below.

As illustrated in FIG. 27, the magnetic head according to the fourth embodiment comprises underlying hard magnetic layers 92a, 92b and soft magnetic layers 91a, 91b laminated thereon, at the positions of the soft magnetic layers 84a, 84b in FIG. 22, respectively. In the fourth embodiment, since the hard magnetic layers 92a, 92b constitute magnetic domain control layers for applying a biasing magnetic field to the free layer 27 for controlling a magnetic domain, the antiferromagnetic layer 63 and non-magnetic metal layer 64 in FIG. 22 are omitted from the structure of the magnetic head in the fourth embodiment.

According to the fourth embodiment, the soft magnetic layers 91a, 91b are formed on both sides of the magneto-resistive layer in the track width direction. Since the soft magnetic layers 91a, 91b act as shield layers for reducing the side-reading, the magnetic head according to the fourth embodiment can reduce the side-reading, and increase the recording density by reducing the track width.

Also, in the fourth embodiment, the soft magnetic layers 91a, 91b additionally function as lead layers for leading a sense current in the CIP structure, so that even if the MR height is reduced in association with an increase in recording density, the soft magnetic layers 91a, 91b can be increased in thickness to prevent a larger lead resistance. Thus, the magnetic head according to the fourth embodiment can also advantageously reduce the side-reading with suffice, while preventing a reduction in head output, even if the MR height is reduced in association with an increase in the recording density. This aspect will be further discussed below.

Assume now that magnetic head according to the fourth embodiment is modified in the following manner in accordance with the conventional CIP structure. Specifically, in accordance with the conventional CIP structure, the soft magnetic layers 91a, 91b shown in FIG. 27 are replaced with lead layers made of a non-magnetic material.

In this case, if the lead layers made of a non-magnetic material are relatively reduced in thickness, the upper magnetic shield layers 31 move downward from the position shown in FIG. 27 on both sides of the magneto-resistive layer in the track width direction, so that the upper magnetic shield layer 31 contributes, to some degree, to a reduction in side-reading. In this event, if the MR height is set at a relatively large value at the cost of a considerable increase in the recording density, the lead layers have a relatively large width in the MR height direction (depth direction when viewed from the ABS side), so that thinner lead layers would not result in an increased lead resistance and a resulting reduction in head output.

However, when the soft magnetic layers 91a, 91b shown in FIG. 27 are replaced with lead layers made of a non-magnetic material, a reduction in the MR height of the lead layers causes the width of the lead layers to be narrower in the MR height direction with the trend of increasing the recording density. Therefore, if the lead layers are kept relatively thin in order to ensure a side-reading reduction effect, the lead resistance will be increased correspondingly. As a result, the head output will be reduced for the reason set forth above. If the read layers were increased in thickness to limit the read resistance with the intention of preventing the reduction in the head output, the upper magnetic shield layer 31 would move upward from the position shown in FIG. 27 on both sides of the magneto-resistive layer in the track width direction, causing the side-reading to significantly appear.

On the other hand, in the fourth embodiment, the soft magnetic layers 91a, 91b additionally function as lead layers for leading a sense current in the CIP structure, so that even if the MR height is reduced, the lead resistance can be reduced by increasing the soft magnetic layers 91a, 91b in thickness. Therefore, the magnetic head according to the fourth embodiment can prevent a reduction in the head output even if it has a smaller MR height. It should be of course understood that the thicker soft magnetic layers 91a, 91b will not at all affect a sufficient reduction in the side-reading achieved thereby.

As will be appreciated from the foregoing, the magnetic head according to the fourth embodiment can advantageously prevent a reduction in the head output, while sufficiently reducing the side-reading, by increasing the soft magnetic layers 91a, 91b in thickness even if the MR height is reduced as required for a higher recording density.

Next, a magnetic disk apparatus according to a fifth embodiment of the present invention will be described with reference to FIG. 28.

Figure 28:
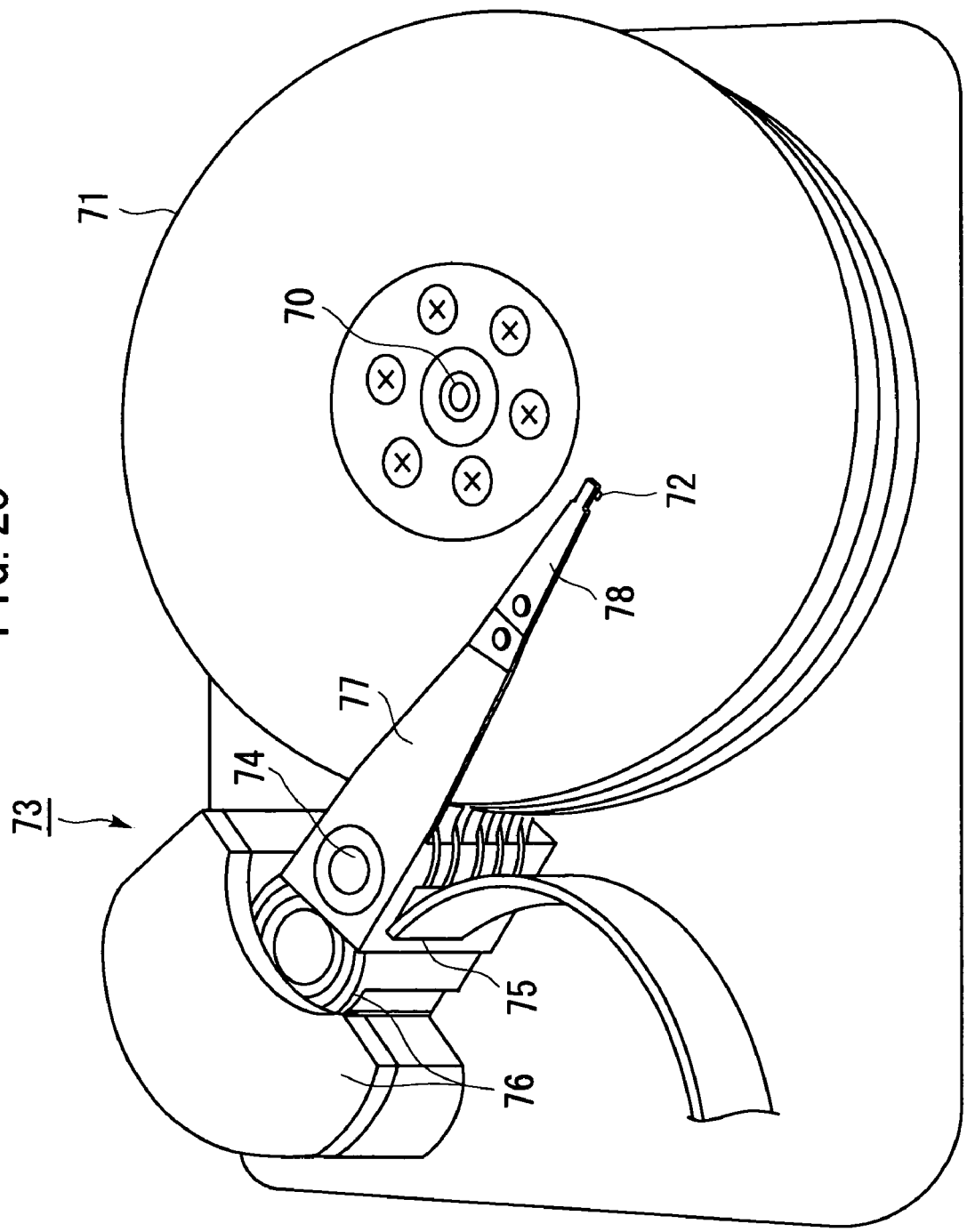
FIG. 28 is a perspective view generally illustrating the configuration of a main portion of a magnetic disk apparatus according to a fifth embodiment of the present invention.

FIG. 28 is a perspective view generally illustrating the configuration of a main portion of a magnetic disk apparatus according to a fifth embodiment of the present invention.

The magnetic disk apparatus according to the fifth embodiment comprises magnetic disks 71 rotatably mounted about a shaft 70; magnetic heads 72 each for recording and reproducing information to or from associated one of the magnetic disks 71; and an assembly carriage device 73 for positioning the magnetic head 72 on a track of the magnetic disk 71.

The assembly carriage device 73 mainly comprises a carriage 75 mounted for pivotal movements about a shaft 74; and an actuator 76 comprised, for example, of a voice coil motor (VCM) for rotating the carriage 75.

The carriage 75 is mounted with bases of a plurality of driving arms 77 which are stacked in the direction of the shaft 74. A head suspension assembly 78 is secured at the leading end of each driving arm 77. Each head suspension assembly 78 has the magnetic head 72 mounted on the leading end thereof. Each head suspension assembly 78 is attached to the leading end of the driving arm 77 such that the associated magnetic head 72 opposes the surface of the associated magnetic disk 71.

In the fifth embodiment, the magnetic disk apparatus comprises any of the magnetic heads according to the first to fourth embodiments described above. Therefore, the magnetic disk apparatus according to the fifth embodiment can advantageously increase the recording density by reducing the track width.

While the present invention has been described in connection with several embodiments, the present invention is not limited to these embodiments.

As described above, the present invention can provide a magnetic head which is capable of reducing the side-reading to narrow the track width for increasing a recording density, as well as to provide a head suspension assembly and a magnetic disk apparatus using the magnetic head.

Also, the present invention can provide a magnetic head which is simple in structure and easy to manufacture but is capable of simultaneously achieving both advantages of: (a) reducing the side-reading to narrow the track width for increasing a recording density; and (b) removing a surface oxide film on a non-magnetic metal layer to reduce the resistance while limiting a damage caused by an ion beam to eventually improve the characteristic of the device, as well as to provide a head suspension assembly and a magnetic disk apparatus using the magnetic head.

What is claimed is:

1. A magnetic head comprising:
a base; and
a magneto-resistive device supported by said base, said magneto-resistive device including:
a magneto-resistive layer formed on one surface side of said base, said magneto-resistive layer including a free layer;
a first film formed to be in contact with an effective region effectively involved in detection of magnetism in said magneto-resistive layer on at least one side of the effective region in a track width direction without overlapping with the effective region; and
a layer for applying a biasing magnetic field to said free layer such that said layer overlaps with said effective region, wherein:
the track width direction is substantially parallel to a film surface of said magneto-resistive layer;
said first film is a single-layer film or a multiple-layer film; and
said first film includes a soft magnetic layer which does not form part of a layer for applying a biasing magnetic field to said free layer.

2. A magnetic head according to claim 1, wherein said effective region is a region in which a current flows in a direction substantially perpendicular to the film surface in said magneto-resistive layer.

3. A magnetic head according to claim 2, wherein said first film includes an insulating layer positioned closest to said base.

4. A magnetic head according to claim 2, wherein:
said magneto-resistive layer includes:
a tunnel barrier layer formed on one surface side of said free layer;
a pinned layer formed on one surface side of said tunnel barrier layer opposite to said free layer; and
a pin layer formed on one surface side of said pinned layer opposite to said tunnel barrier layer, and
said first film is in contact with an end face of said tunnel barrier layer.

5. A magnetic head according to claim 2, wherein said magneto-resistive layer includes:
a non-magnetic metal layer formed on one surface side of said free layer;
a pinned layer formed on one surface side of said non-magnetic metal layer opposite to said free layer; and
a pin layer formed on one surface side of said pinned layer opposite to said non-magnetic metal layer.

6. A magnetic head according to claim 1, wherein said effective region is a region in which a current flows in a direction substantially parallel to the film surface in said magneto-resistive layer.

7. A magnetic head according to claim 6, wherein said magneto-resistive layer includes:
a non-magnetic metal layer formed on one surface side of said free layer;
a pinned layer formed on one surface side of said non-magnetic metal layer opposite to said free layer; and
a pin layer formed on one surface side of said pinned layer opposite to said non-magnetic metal layer.

8. A magnetic head according to claim 1, wherein said first film includes a layer for applying a biasing magnetic field to said free layer.

9. A magnetic head comprising:
a base; and
a magneto-resistive device supported by said base, said magneto-resistive device including:
a magneto-resistive layer formed on one surface side of said base, said magneto-resistive layer including a free layer; and
a first film formed to be in contact with an effective region effectively involved in detection of magnetism in said magneto-resistive layer on at least one side of the effective region in a track width direction without overlapping with the effective region, wherein:
the track width direction is substantially parallel to a film surface of said magneto-resistive layer;
said first film is a single-layer film;
said first film includes a soft magnetic layer which does not form part of a layer for applying a biasing magnetic field to said free layer; and
said first film is in contact with said effective region as well on a side of said effective region opposite to a magnetic recording medium.

10. A head suspension assembly comprising:
a magnetic head according to claim 9; and
a suspension for supporting said magnetic head mounted near a leading end thereof.

11. A magnetic disk apparatus comprising:
a head suspension assembly according to claim 10;
an arm for supporting said head suspension assembly; and
an actuator for moving said arm to position said magnetic head.

12. A magnetic head according to claim 9, wherein said effective region is a region in which a current flows in a direction substantially perpendicular to the film surface in said magneto-resistive layer.

13. A magnetic head according to claim 9, further comprising a layer for applying a biasing magnetic field to said free layer such that said layer overlaps with said effective region.

* * * * *